US012564017B2

(12) United States Patent
Sung et al.

(10) Patent No.: US 12,564,017 B2
(45) Date of Patent: Feb. 24, 2026

(54) WAFER STACKING METHOD

(71) Applicant: Powerchip Semiconductor Manufacturing Corporation, Hsinchu (TW)

(72) Inventors: Chih Feng Sung, Hsinchu (TW); Wei Han Huang, Hsinchu (TW); Ming-Jui Tsai, Hsinchu (TW); Yu Chi Chen, Hsinchu (TW); Yung-Hsiang Chang, Hsinchu (TW); Chun-Lin Lu, Hsinchu (TW); Shih-Ping Lee, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 370 days.

(21) Appl. No.: 18/311,894

(22) Filed: May 4, 2023

(65) Prior Publication Data

US 2024/0355684 A1      Oct. 24, 2024

(30) Foreign Application Priority Data

Apr. 19, 2023    (TW) ................................. 112114574

(51) Int. Cl.
 *H01L 21/66*        (2006.01)
 *H01L 21/304*       (2006.01)
 *H01L 23/00*        (2006.01)
(52) U.S. Cl.
 CPC ............ *H01L 22/12* (2013.01); *H01L 21/304* (2013.01); *H01L 24/80* (2013.01); *H01L 2224/80895* (2013.01); *H01L 2224/80896* (2013.01)

(58) Field of Classification Search
 CPC ........ H01L 22/12; H01L 21/304; H01L 24/80
 See application file for complete search history.

(56) References Cited

U.S. PATENT DOCUMENTS

| | | | |
|---|---|---|---|
| 7,790,569 B2 | 9/2010 | Knechtel et al. | |
| 8,119,500 B2 | 2/2012 | Yang et al. | |
| 11,682,551 B2 * | 6/2023 | Chiang ............. | H01L 21/02021 257/797 |

(Continued)

FOREIGN PATENT DOCUMENTS

| | | |
|---|---|---|
| TW | 201000888 | 1/2010 |
| TW | 201430982 | 8/2014 |

(Continued)

OTHER PUBLICATIONS

"Office Action of Taiwan Counterpart Application", issued on Mar. 7, 2024, p. 1-p. 9.

*Primary Examiner* — Richard A Booth
(74) *Attorney, Agent, or Firm* — JCIPRNET

(57) ABSTRACT

A wafer stacking method includes the following steps. A first wafer is provided. A second wafer is bonded to the first wafer to form a first wafer stack structure. A first edge defect inspection is performed on the first wafer stack structure to find a first edge defect and measure a first distance in a radial direction between an edge of the first wafer stack structure and an end of the first edge defect away from the edge of the first wafer stack structure. A first trimming process with a range of a first width is performed from the edge of the first wafer stack structure to remove the first edge defect. Herein, the first width is greater than or equal to the first distance.

18 Claims, 26 Drawing Sheets

(56)  References Cited

U.S. PATENT DOCUMENTS

| 2012/0058623 | A1 |    | 3/2012  | Hsieh |  |
| 2014/0106649 | A1 |    | 4/2014  | Kim et al. |  |
| 2019/0157395 | A1 |    | 5/2019  | Schulze et al. |  |
| 2019/0312007 | A1 | * | 10/2019 | Nagata | H01L 21/187 |

FOREIGN PATENT DOCUMENTS

| TW | 201727222 | 8/2017 |
| TW | 201923883 | 6/2019 |
| TW | 201944866 | 11/2019 |
| TW | 202221761 | 6/2022 |

* cited by examiner

WAFER STACKING METHOD

CROSS-REFERENCE TO RELATED APPLICATION

This application claims the priority benefit of Taiwan application serial no. 112114574, filed on Apr. 19, 2023. The entirety of the above-mentioned patent application is hereby incorporated by reference herein and made a part of this specification.

BACKGROUND

Technical Field

The disclosure relates to a semiconductor process, and in particular, relates to a wafer stacking method.

Description of Related Art

At present, a wafer stack structure has been developed. In the wafer stack structure, wafers are bonded together to form the structure. However, after the wafers are bonded, an edge defect (e.g., a crack and/or a bubble) occurs most of the time between two adjacent wafers in the wafer stack structure. Therefore, how to effectively remove the edge defect is an important issue.

SUMMARY

The disclosure provides a wafer stacking method capable of effectively removing an edge defect.

The disclosure provides a wafer stacking method, and the method includes the following steps. A first wafer is provided. A second wafer is bonded to the first wafer to form a first wafer stack structure. A first edge defect inspection is performed on the first wafer stack structure to find a first edge defect and measure a first distance in a radial direction between an edge of the first wafer stack structure and an end of the first edge defect away from the edge of the first wafer stack structure. A first trimming process with a range of a first width is performed from the edge of the first wafer stack structure to remove the first edge defect. Herein, the first width is greater than or equal to the first distance.

According to an embodiment of the disclosure, in the wafer stacking method, a machine used for the first edge defect inspection is, for example, a C-mode scanning acoustic microscope (CSAM).

According to an embodiment of the disclosure, the wafer stacking method further includes the following steps. A thinning process is performed on the second wafer after the first trimming process is performed.

According to an embodiment of the disclosure, in the wafer stacking method, the second wafer includes a through-substrate via (TSV). The wafer stacking method further includes the following steps. A portion of the second wafer is removed to expose the through-substrate via. A redistribution layer structure is formed on the second wafer. The redistribution layer structure is electrically connected to the through-substrate via.

According to an embodiment of the disclosure, the wafer stacking method further includes the following steps. A passivation layer is formed on the first wafer stack structure after the first trimming process is performed and before the through-substrate via is exposed.

According to an embodiment of the disclosure, the wafer stacking method further includes the following steps. A third wafer is bonded to the second wafer to form a second wafer stack structure. A second edge defect inspection is performed on the second wafer stack structure to find a second edge defect and measure a second distance in the radial direction between an edge of the second wafer stack structure and an end of the second edge defect away from the edge of the second wafer stack structure. A second trimming process with a range of a second width is performed from the edge of the second wafer stack structure to remove the second edge defect. Herein, the second width is greater than or equal to the second distance.

According to an embodiment of the disclosure, in the wafer stacking method, the second width is greater than the first width.

According to an embodiment of the disclosure, the wafer stacking method further includes the following steps. A thinning process is performed on the third wafer after the second trimming process is performed.

According to an embodiment of the disclosure, in the wafer stacking method, the third wafer includes a through-substrate via. The wafer stacking method further includes the following steps. A portion of the third wafer is removed to expose the through-substrate via. A redistribution layer structure is formed on the third wafer. The redistribution layer structure is electrically connected to the through-substrate via.

According to an embodiment of the disclosure, the wafer stacking method further includes the following steps. A passivation layer is formed on the second wafer stack structure after the second trimming process is performed and before the through-substrate via is exposed.

According to an embodiment of the disclosure, the wafer stacking method further includes the following steps. A fourth wafer is bonded to the third wafer to form a third wafer stack structure. A third edge defect inspection is performed on the third wafer stack structure to find a third edge defect and measure a third distance in the radial direction between an edge of the third wafer stack structure and an end of the third edge defect away from the edge of the third wafer stack structure. A third trimming process with a range of a third width is performed from the edge of the third wafer stack structure to remove the third edge defect. Herein, the third width is greater than or equal to the third distance.

According to an embodiment of the disclosure, in the wafer stacking method, the third width is greater than the second width.

According to an embodiment of the disclosure, the wafer stacking method further includes the following steps. A thinning process is performed on the fourth wafer after the third trimming process is performed.

According to an embodiment of the disclosure, in the wafer stacking method, the fourth wafer includes a through-substrate via. The wafer stacking method further includes the following steps. A portion of the fourth wafer is removed to expose the through-substrate via. A redistribution layer structure is formed on the fourth wafer. The redistribution layer structure is electrically connected to the through-substrate via.

According to an embodiment of the disclosure, the wafer stacking method further includes the following steps. A passivation layer is formed on the third wafer stack structure after the third trimming process is performed and before the through-substrate via is exposed.

According to an embodiment of the disclosure, the wafer stacking method further includes the following steps. A third wafer is provided. A fourth wafer is bonded to the third wafer to form a second wafer stack structure. A second edge defect inspection is performed on the second wafer stack structure to find a second edge defect and measure a second distance in the radial direction between an edge of the second wafer stack structure and an end of the second edge defect away from the edge of the second wafer stack structure. A second trimming process with a range of a second width is performed from the edge of the second wafer stack structure to remove the second edge defect. Herein, the second width is greater than or equal to the second distance.

According to an embodiment of the disclosure, the wafer stacking method further includes the following steps. The fourth wafer is bonded to the second wafer to form a third wafer stack structure. A third edge defect inspection is performed on the third wafer stack structure to find a third edge defect and measure a third distance in the radial direction between an edge of the third wafer stack structure and an end of the third edge defect away from the edge of the third wafer stack structure. A third trimming process with a range of a third width is performed from the edge of the third wafer stack structure to remove the third edge defect. Herein, the third width is greater than or equal to the third distance.

According to an embodiment of the disclosure, in the wafer stacking method, the third width is greater than the first width and the second width.

According to an embodiment of the disclosure, in the wafer stacking method, the first width and the second width are the same width.

According to an embodiment of the disclosure, in the wafer stacking method, the first width and the second width are different widths.

To sum up, in the wafer stacking method provided by the disclosure, the first edge defect inspection is performed on the wafer stack structure including the first wafer and the second wafer to find the first edge defect (e.g., a crack and/or a bubble) and measure the first distance in the radial direction between the edge of the first wafer stack structure and the end of the first edge defect away from the edge of the first wafer stack structure. Next, the first trimming process with the range of the first width is performed from the edge of the first wafer stack structure to remove the first edge defect. Herein, the first width is greater than or equal to the first distance. Therefore, through the wafer stacking method provided by the disclosure, the first edge defect is effectively removed, and the yield is thus further improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
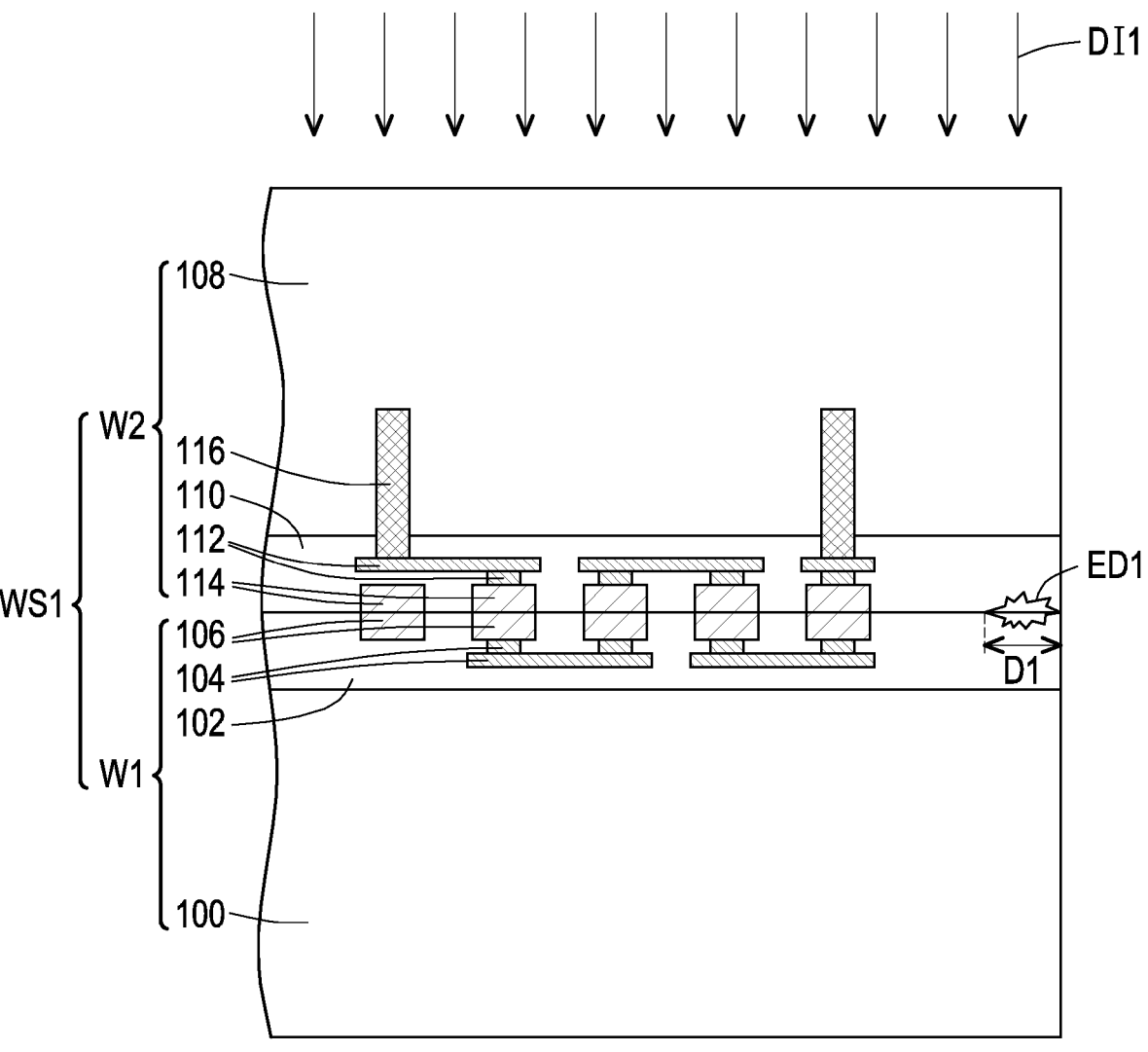
FIG. 1A to FIG. 1O are cross-sectional views of a wafer stacking method according to some embodiments of the disclosure.

Embodiments accompanied with drawings are provided below to further describe the disclosure in details, but the embodiments provided below are not intended to limit the scope of the disclosure. To facilitate understanding, the same components will hereinafter be denoted by the same reference numerals. In addition, the accompanying drawings are provided for illustrative purposes only and are not drawn according to the original dimensions. In fact, the dimensions of the various features may be arbitrarily increased or decreased for clarity of description.

Figure 1B:
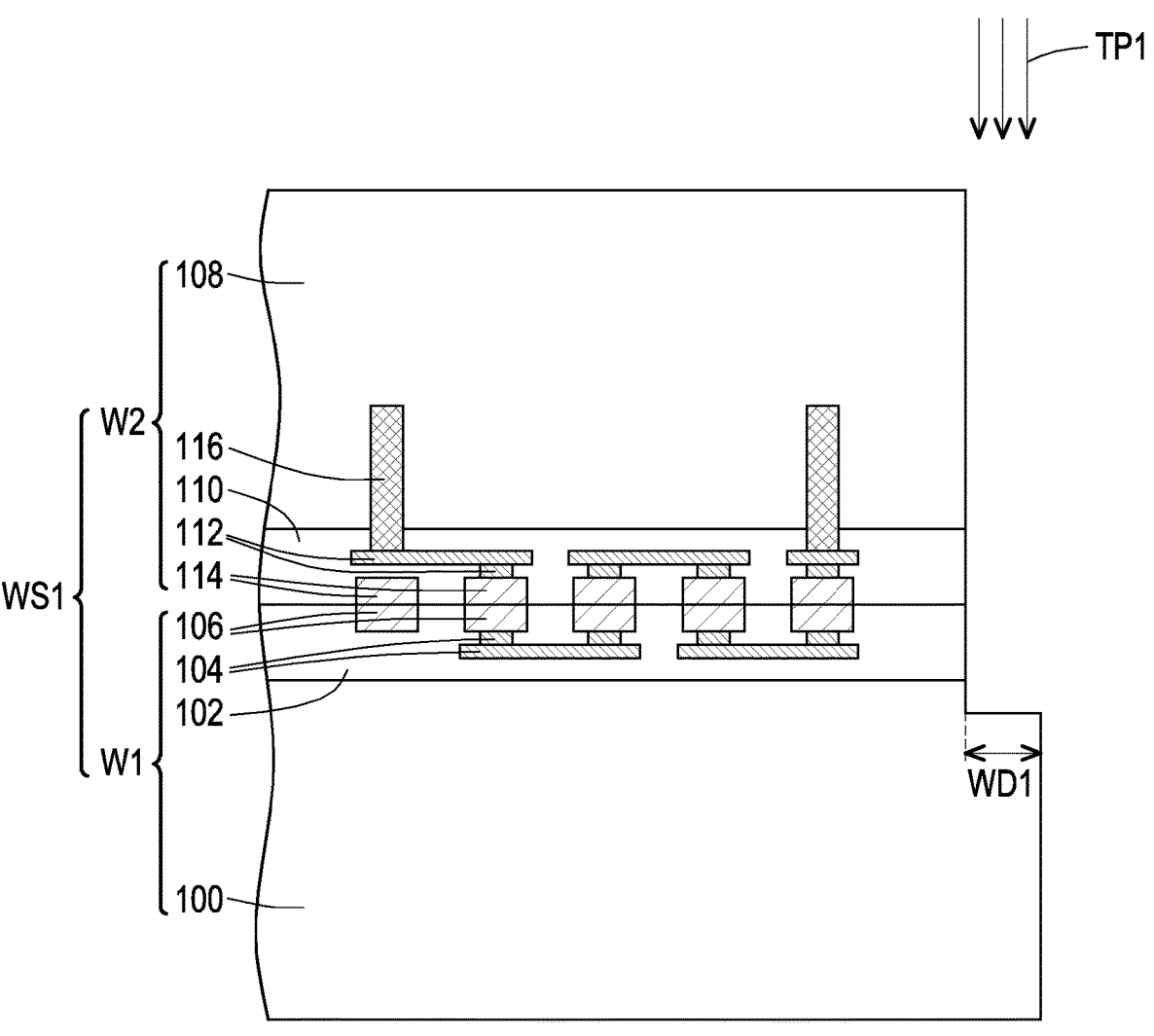
Figure 1C:
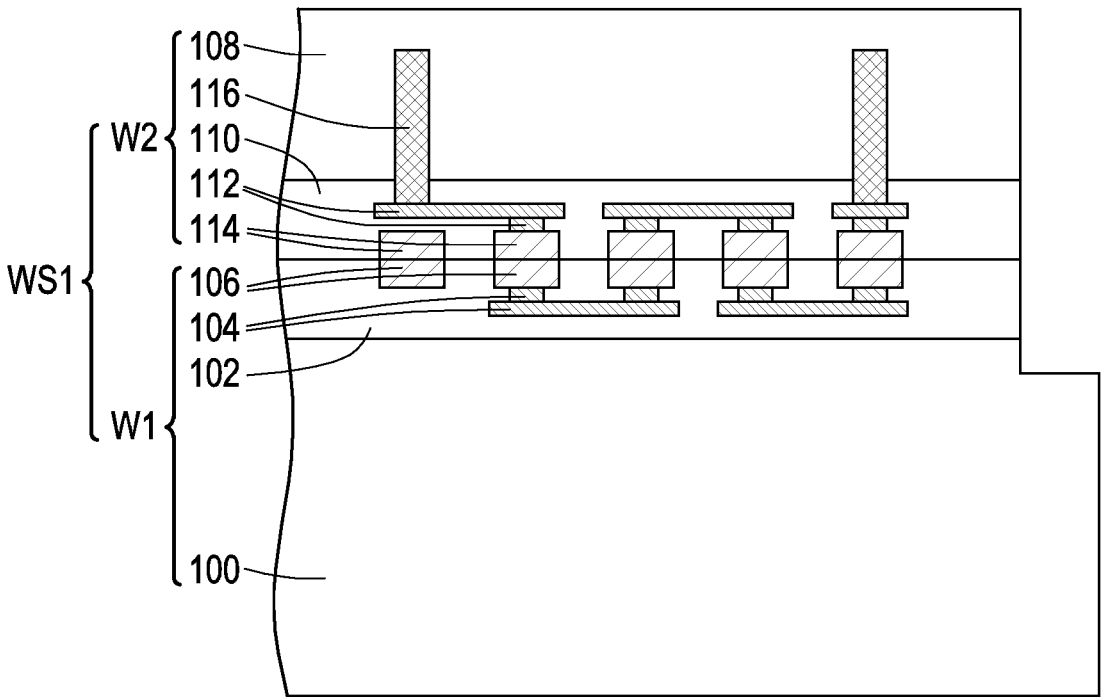
Figure 1D:
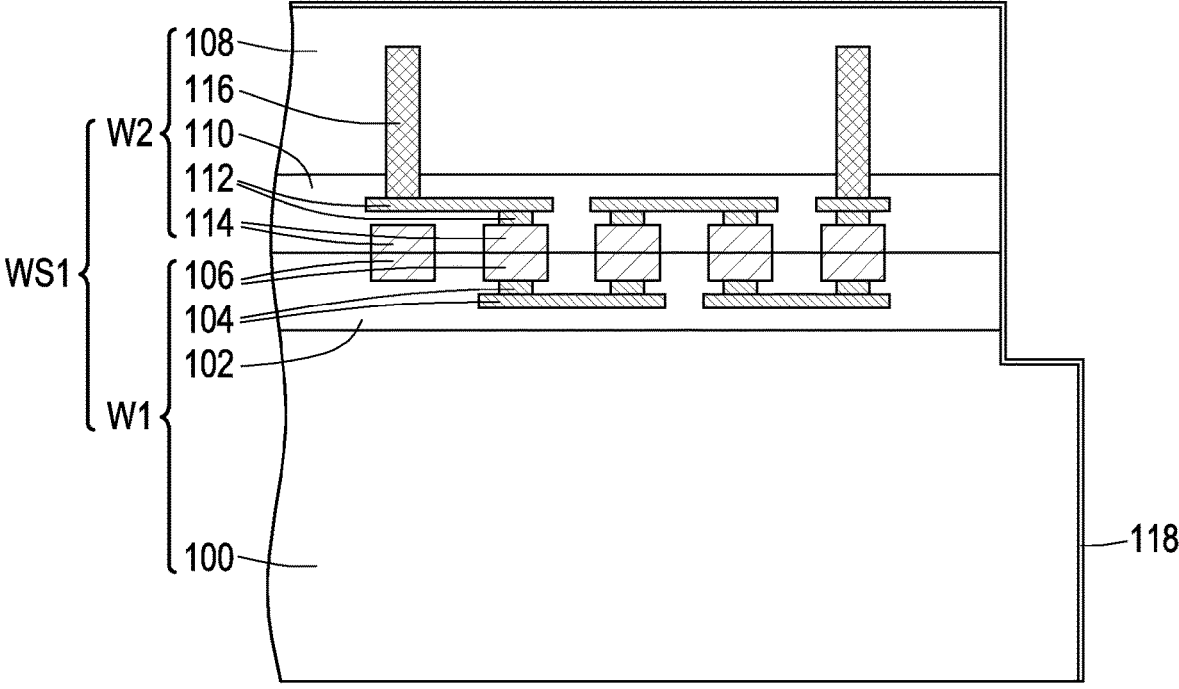
Figure 1E:
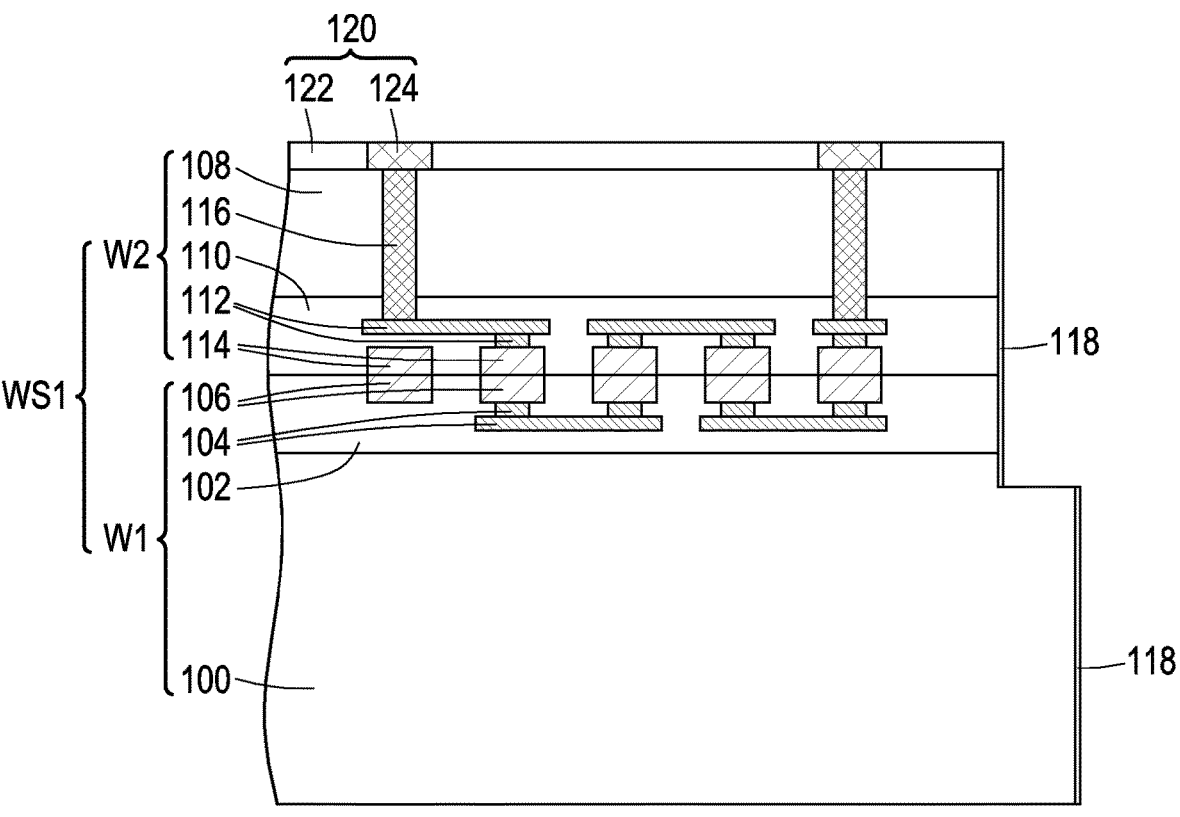
Figure 1F:
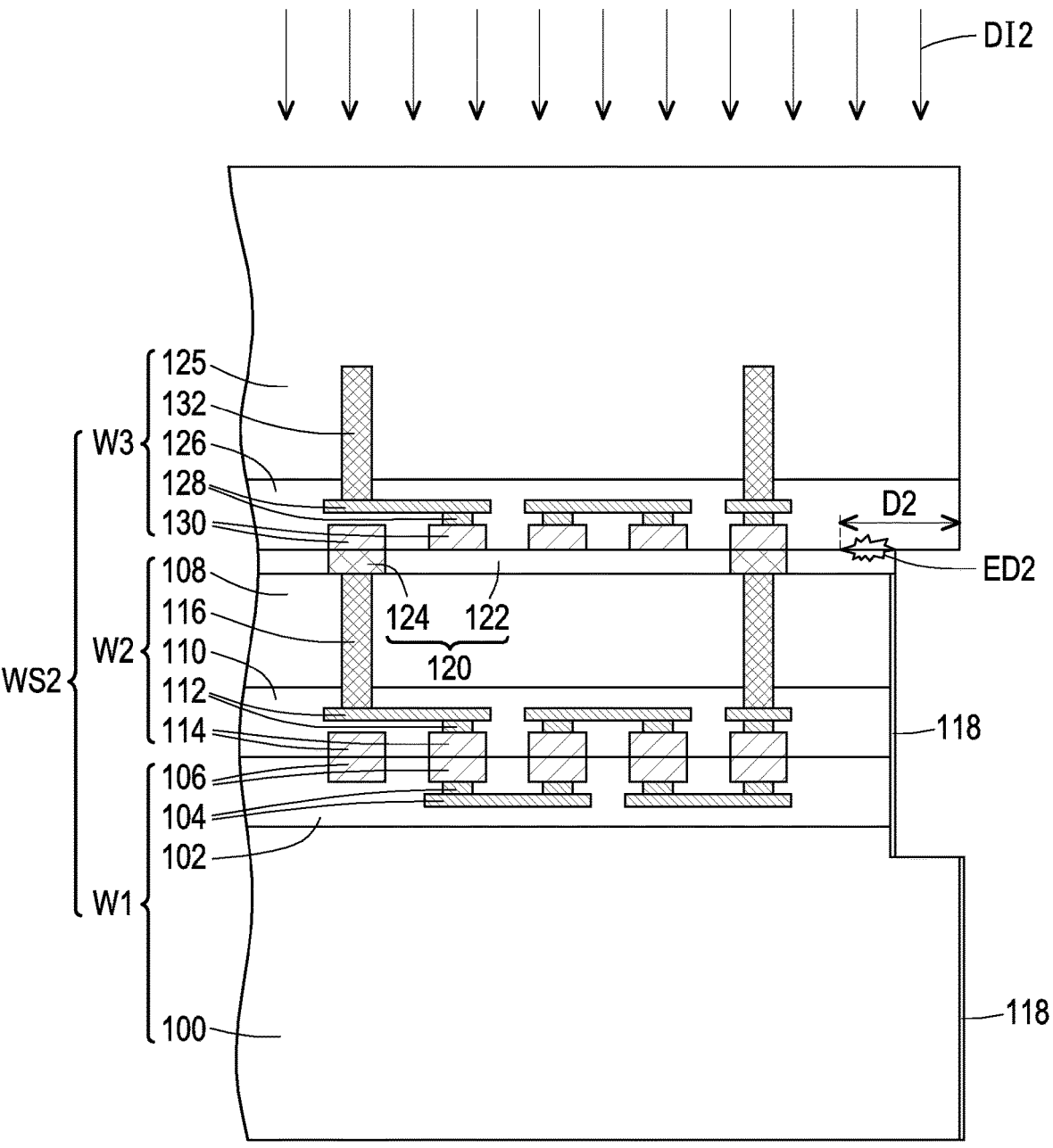
Figure 1G:
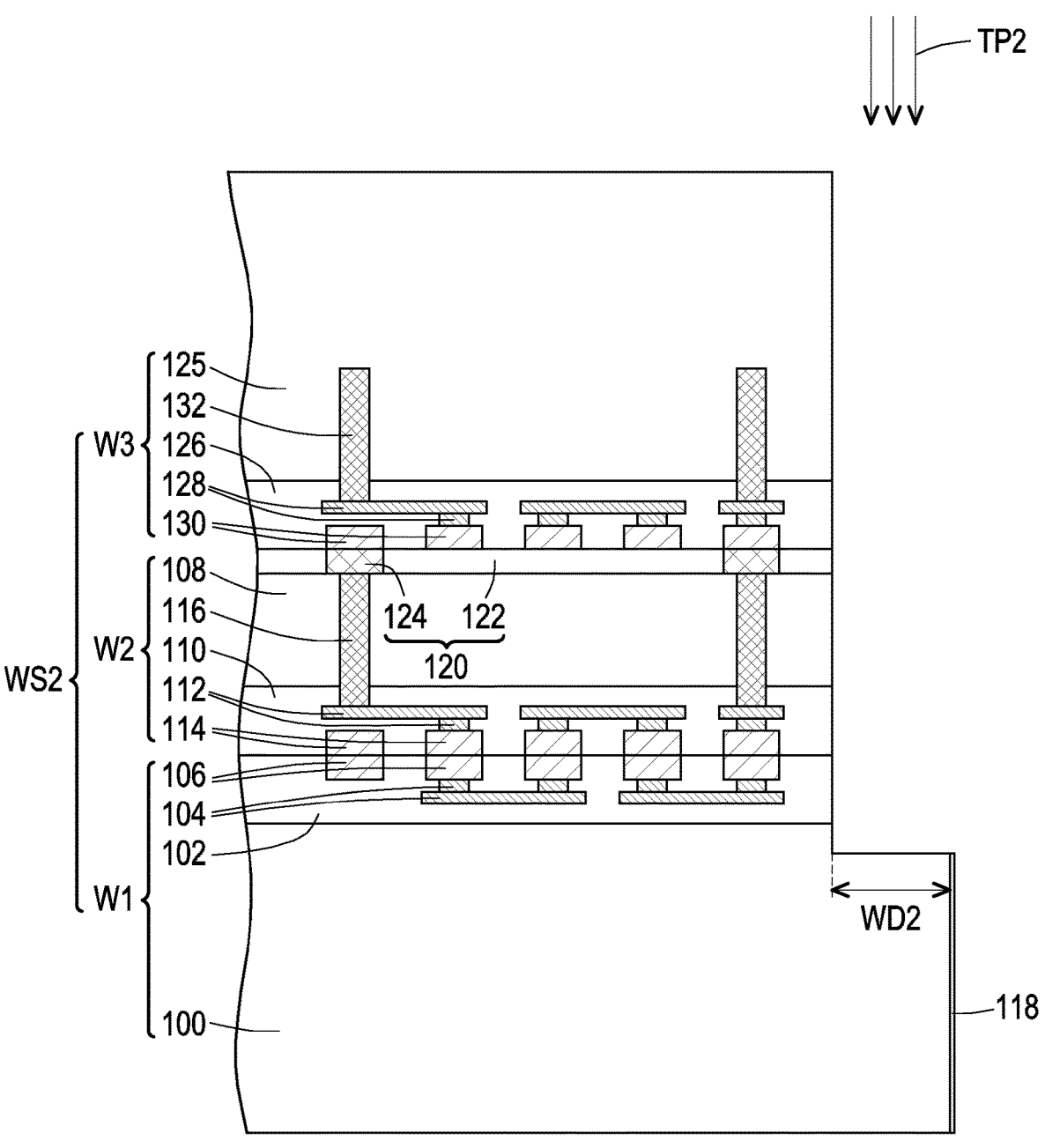
Figure 1H:
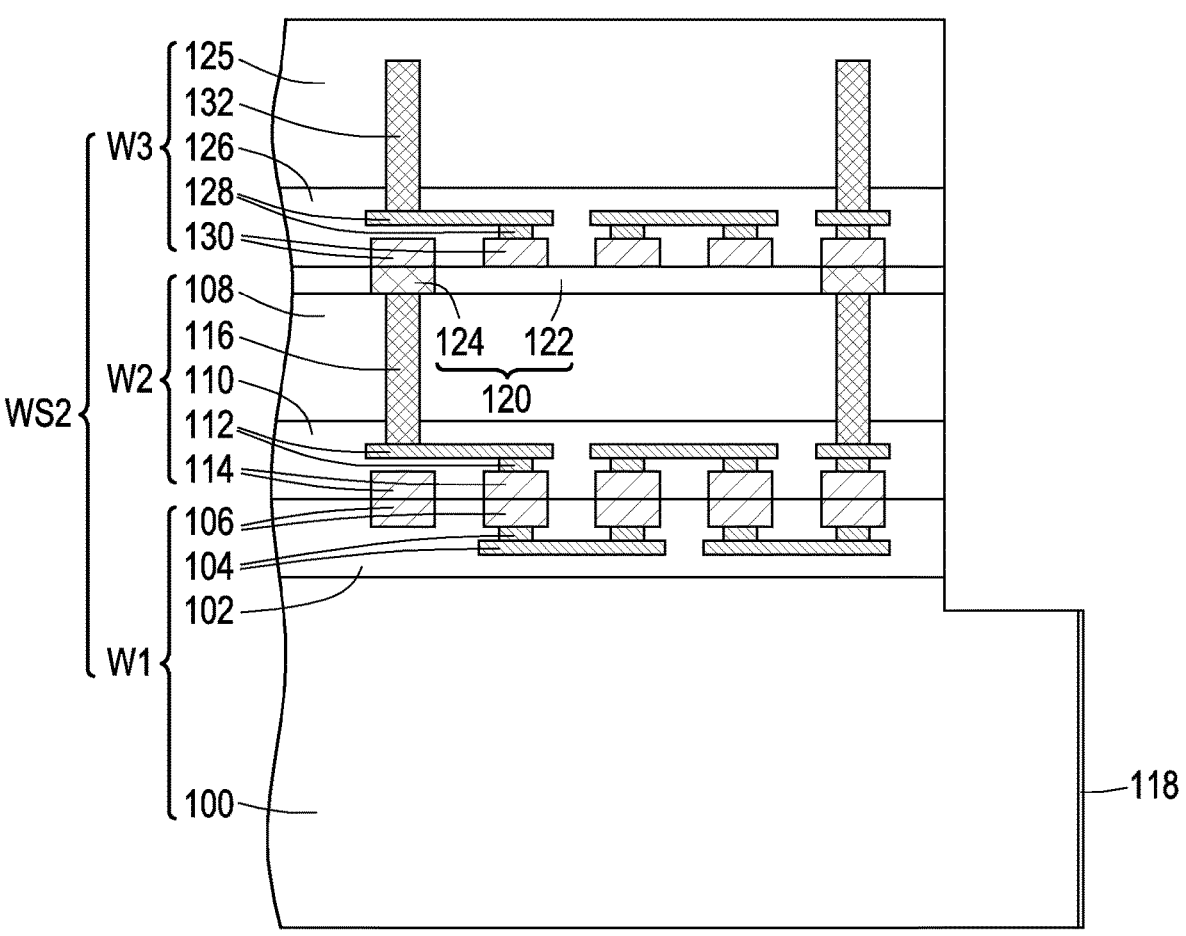
Figure 1I:
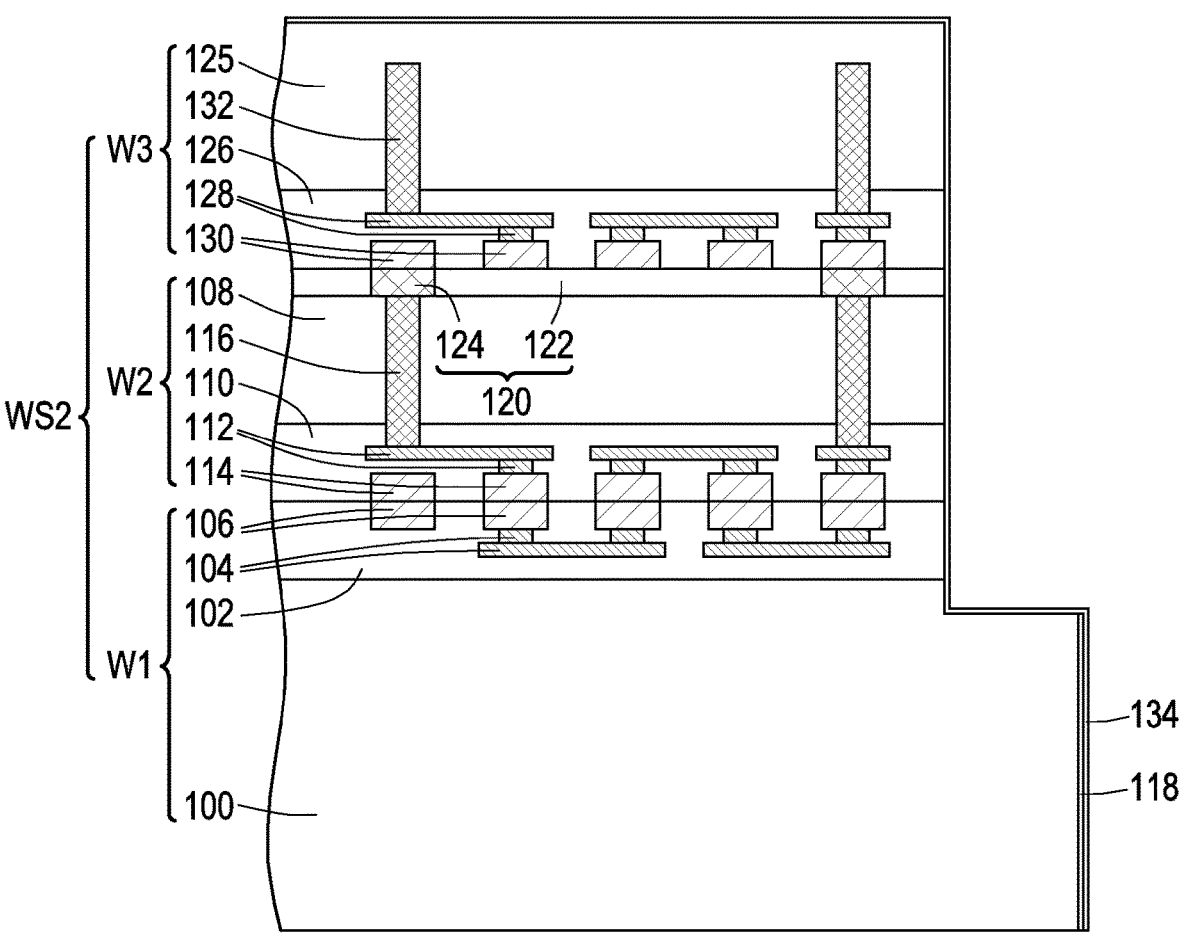
Figure 1J:
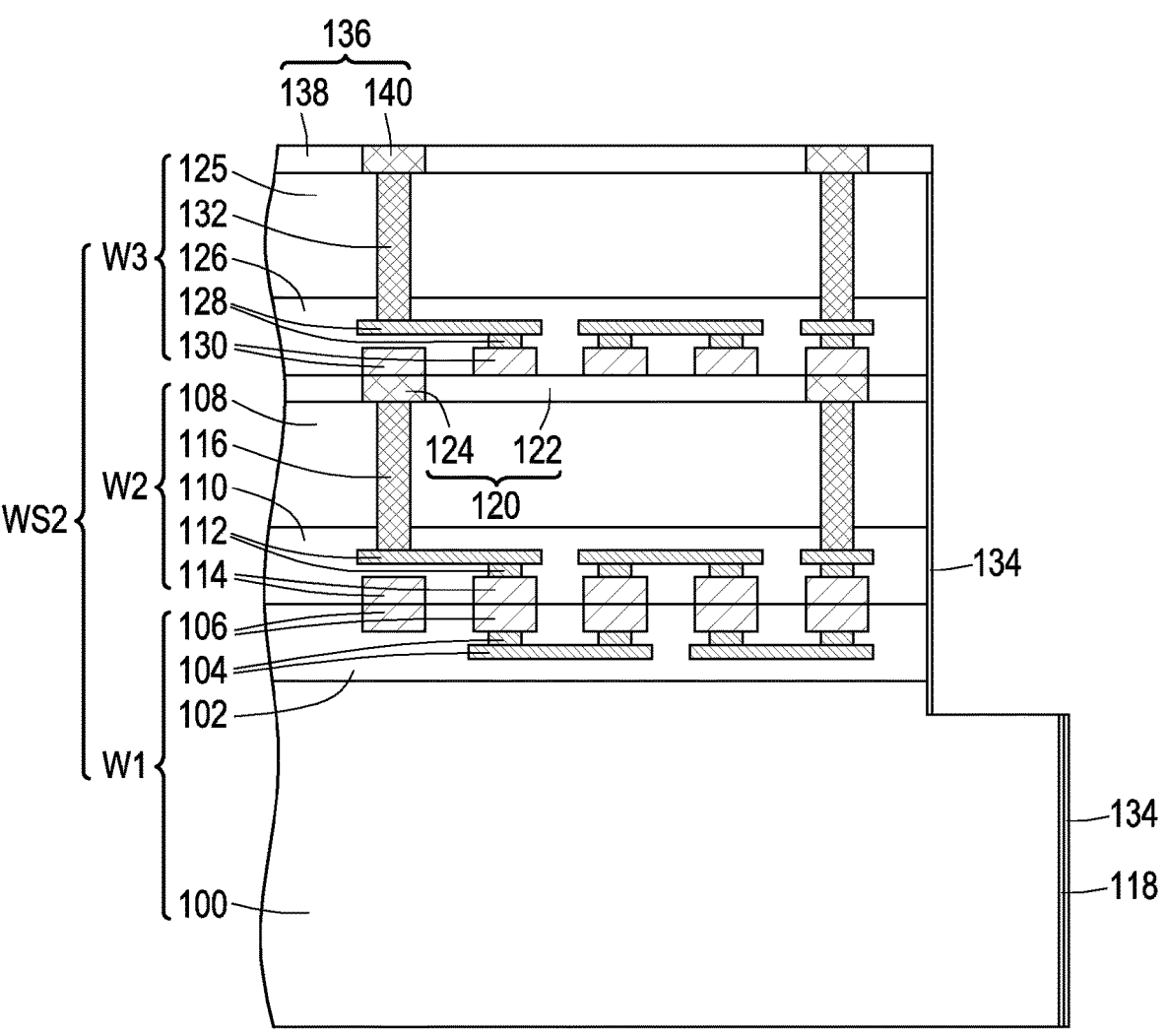
Figure 1K:
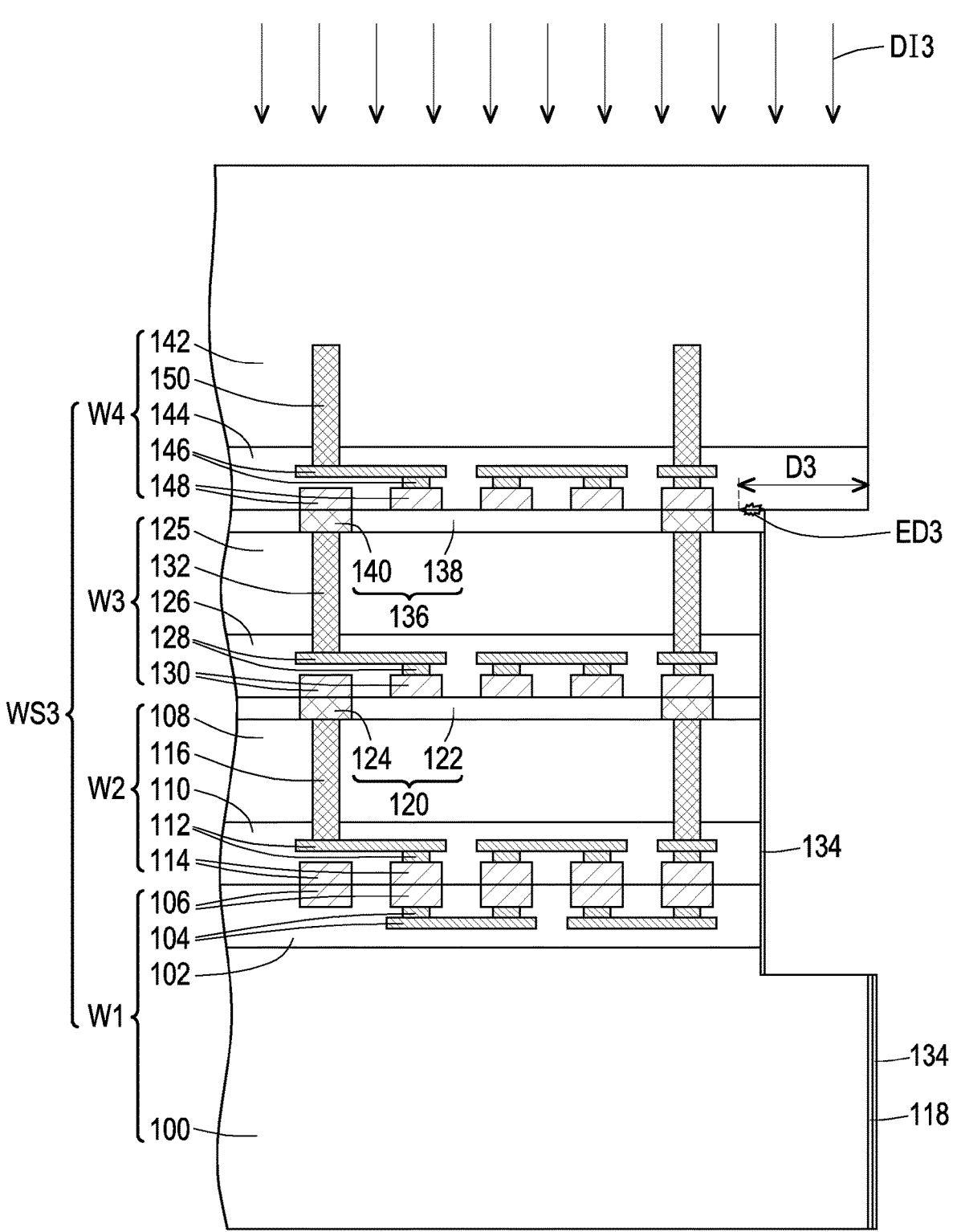
Figure 1L:
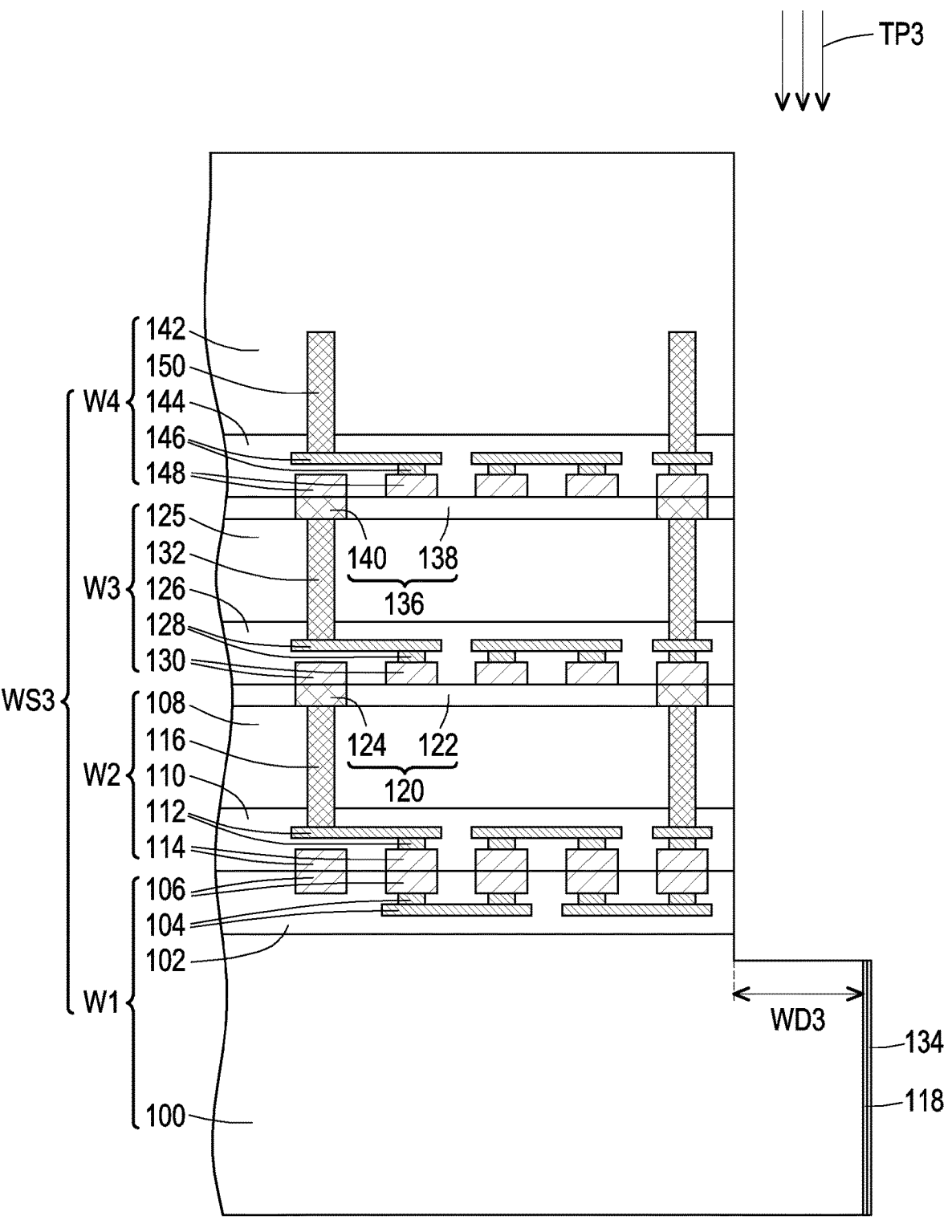
Figure 1M:
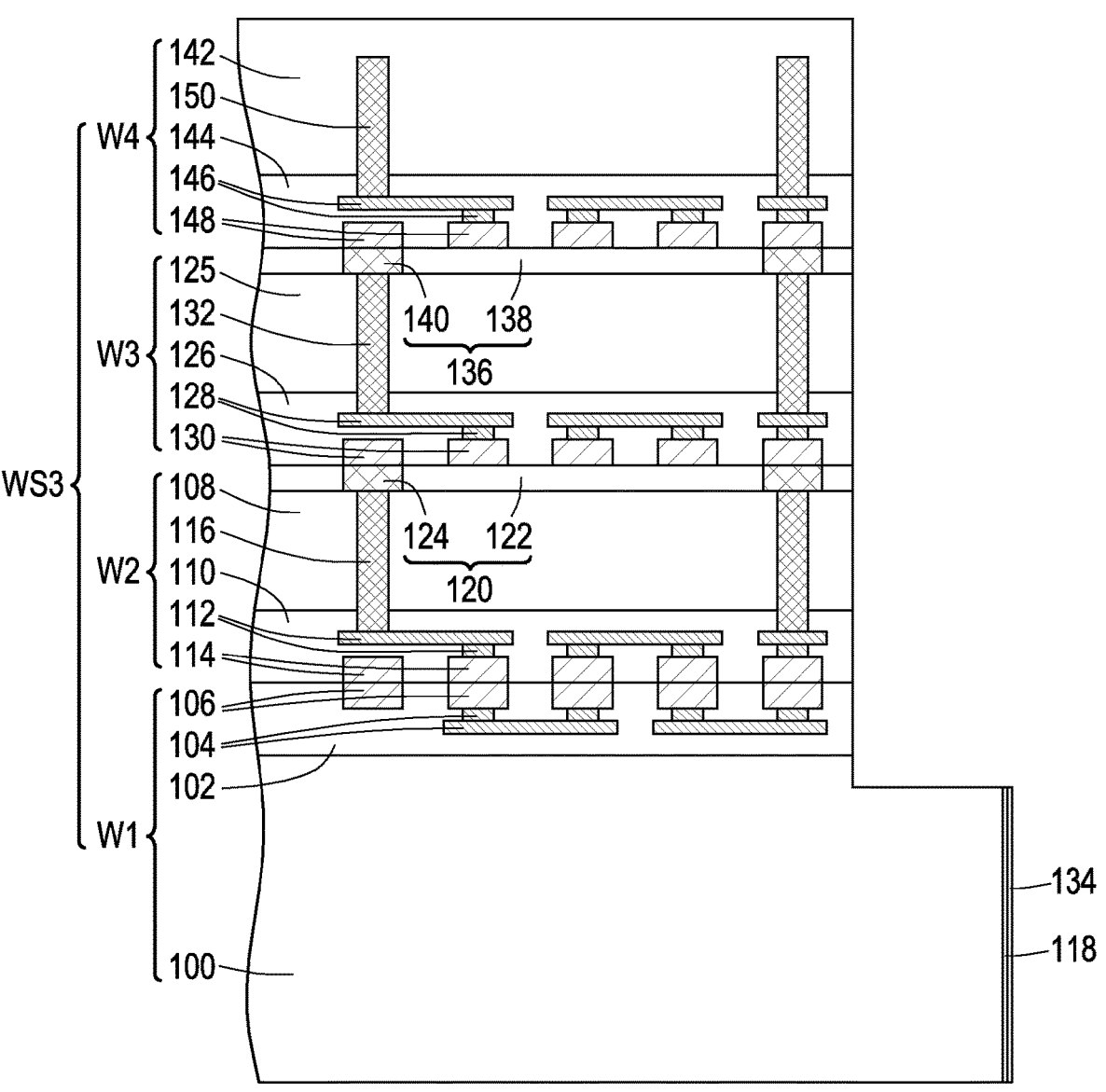
Figure 1N:
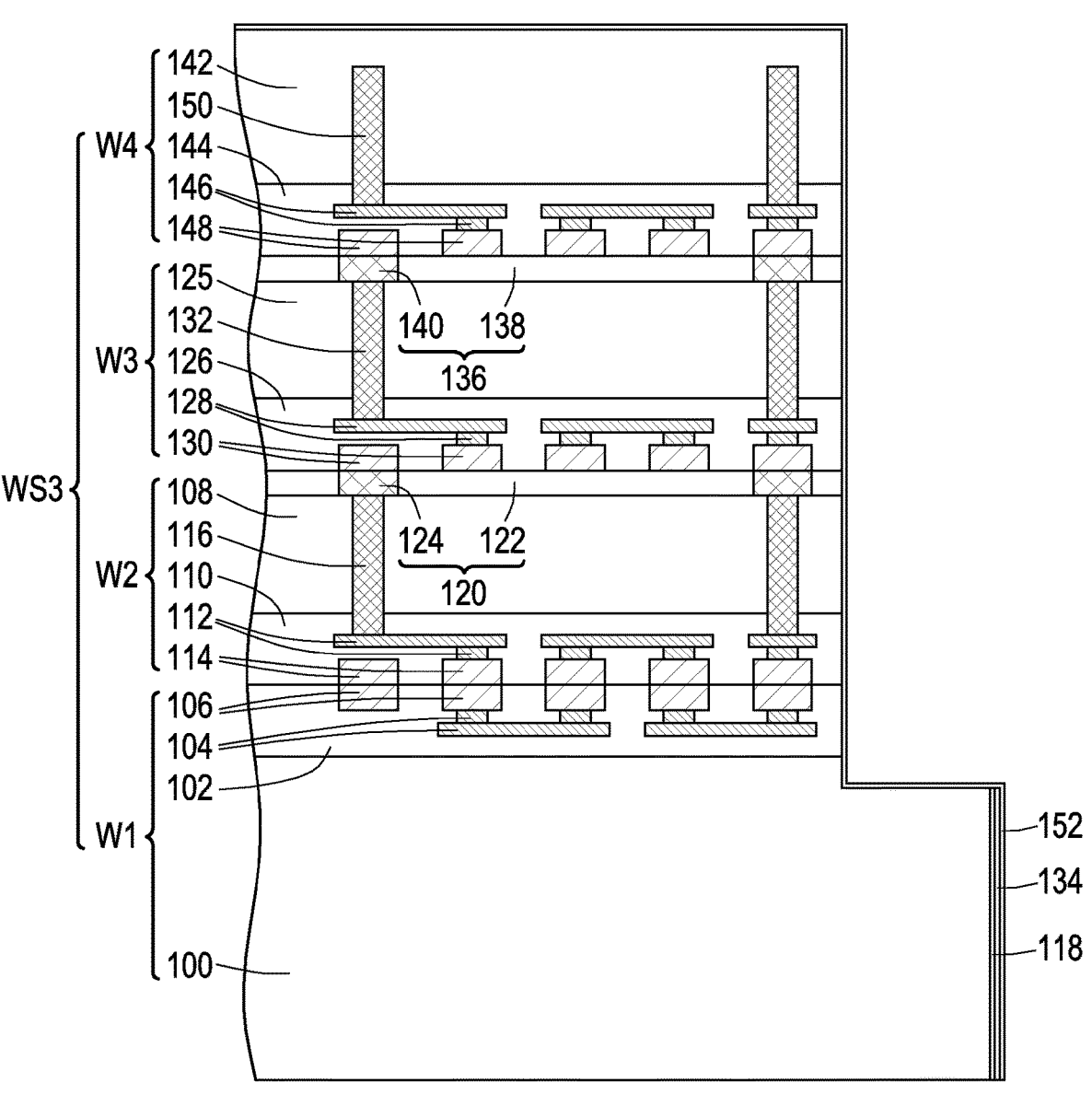
Figure 1O:
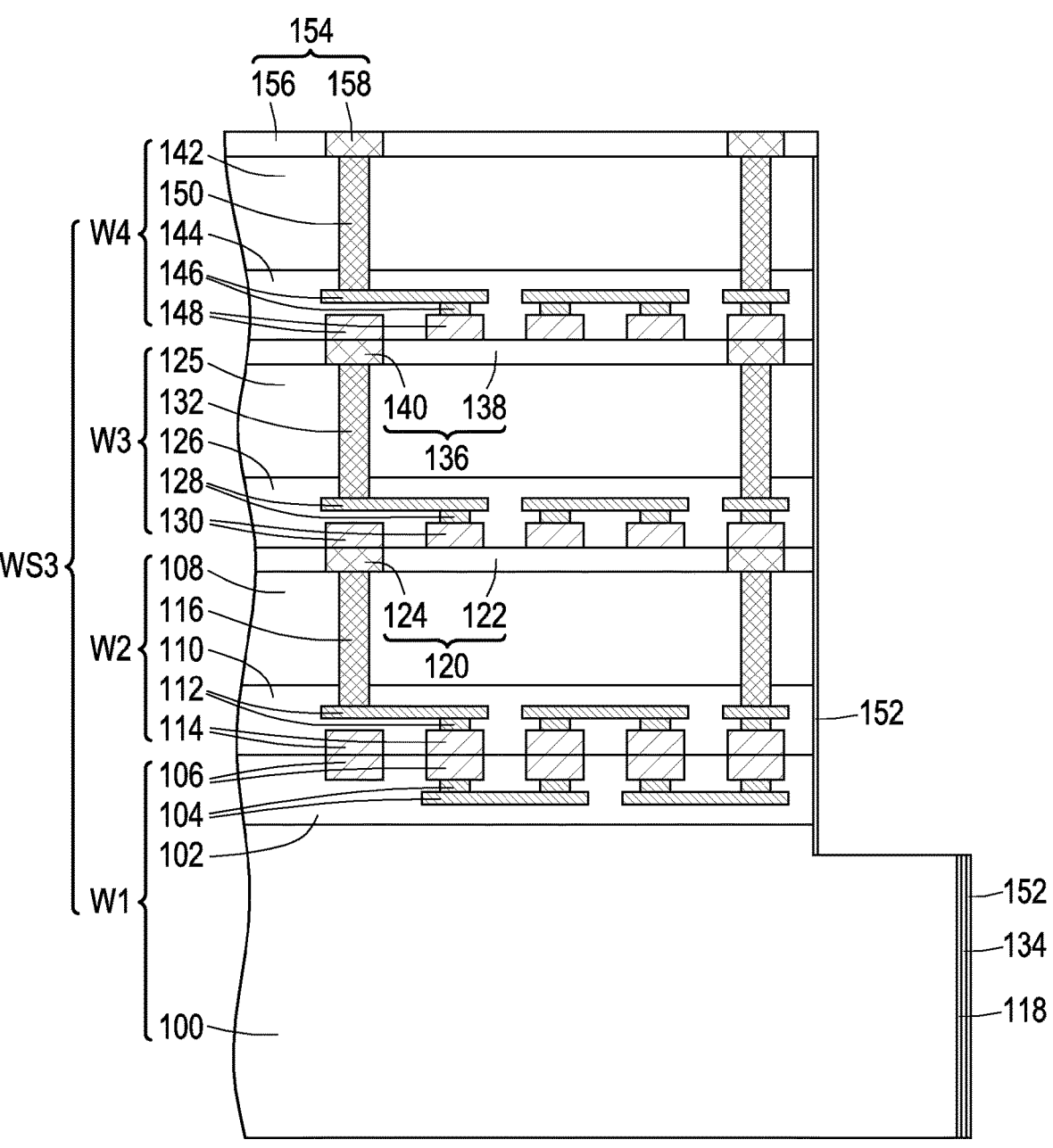

FIG. 1A to FIG. 1O are cross-sectional views of a wafer stacking method according to some embodiments of the disclosure.

With reference to FIG. 1A, a wafer W1 is provided. In some embodiments, the wafer W1 may include a substrate 100, a dielectric layer 102, an interconnect structure 104, and a bonding pad 106. The substrate 100 may be a semiconductor substrate, such as a silicon substrate. The dielectric layer 102 is located on the substrate 100. Besides, although not shown in the figure, required semiconductor devices (e.g., active devices and/or passive devices) may be provided on the substrate 100. In some embodiments, the dielectric layer 102 may be a multilayer structure. A material of the dielectric layer 102 is, for example, silicon oxide, silicon nitride, or a combination of the foregoing. The interconnect structure 104 is located in the dielectric layer 102. A material of the interconnect structure 104 is, for example, copper, aluminum, tungsten, tantalum, tantalum nitride, titanium, titanium nitride, or a combination of the foregoing. Further, a person having ordinary skill in the art can adjust the number of layers and configuration of the interconnection structure 104 according to needs. The bonding pad 106 is located in the dielectric layer 102 and may be electrically connected to the interconnect structure 104. A material of the bonding pad 106 is, for example, a conductive material such as copper.

Next, a wafer W2 is bonded to the wafer W1 to form a wafer stack structure WS1. In some embodiments, the wafer W2 may include a substrate 108, a dielectric layer 110, an interconnect structure 112, a bonding pad 114, and a through-substrate via 116. The substrate 108 may be a semiconductor substrate, such as a silicon substrate. The dielectric layer 110 is located on the substrate 108. Besides, although not shown in the figure, required semiconductor devices (e.g., active devices and/or passive devices) may be provided on the substrate 108. In some embodiments, the dielectric layer 110 may be a multilayer structure. A material of the dielectric layer 110 is, for example, silicon oxide, silicon nitride, or a combination of the foregoing. The interconnect structure 112 is located in the dielectric layer 110. A material of the interconnect structure 112 is, for example, copper, aluminum, tungsten, tantalum, tantalum nitride, titanium, titanium nitride, or a combination of the foregoing. Further, a person having ordinary skill in the art can adjust the number of layers and configuration of the interconnection structure 112 according to needs. The bonding pad 114 is located in the dielectric layer 110 and may be electrically connected to the interconnect structure 112. A material of the bonding pad 114 is, for example, a conductive material such as copper. The through-substrate via 116 is located in substrate 108 and may further be located in dielectric layer 110. The through-substrate via 116 may be electrically connected to the interconnect structure 112. A material of the through-substrate via 116 is, for example, copper, tantalum, tantalum nitride, or a combination of the foregoing.

In some embodiments, the method of bonding the wafer W2 to the wafer W1 includes a hybrid bonding method. For instance, the bonding pad 114 may be bonded to the bonding pad 106, the dielectric layer 110 may be bonded to the dielectric layer 102, and the wafer W2 may be bonded to the wafer W1 through the hybrid bonding method, but the disclosure is not limited thereto.

Next, an edge defect inspection DI1 is performed on the wafer stack structure WS1 to find an edge defect ED1 (e.g., a crack and/or a bubble) and measure a distance D1 in a radial direction between an edge of the wafer stack structure WS1 and an end of the edge defect ED1 away from the edge of the wafer stack structure WS1. In some embodiments, the edge defect ED1 may be located between the wafer W2 and the wafer W1. In some embodiments, the distance D1 is, for example, 1 millimeter (mm) to 2.5 millimeters. In some embodiments, a machine used for the edge defect inspection DI1 is, for example, a C-mode scanning acoustic microscope (CSAM).

With reference to FIG. 1B, a trimming process TP1 with a range of a width WD1 is performed from the edge of the wafer stack structure WS1 to remove the edge defect ED1. Herein, the width WD1 is greater than or equal to the distance D1. In this way, the edge defect ED1 may be effectively removed, and the yield is thus further improved. In some embodiments, the trimming process TP1 may completely remove the edge defect ED1. In some embodiments, the width WD1 is, for example, 1 millimeter to 2.5 millimeters. In some embodiments, the trimming process TP1 may remove a portion of the substrate 108, a portion of the dielectric layer 110, a portion of the dielectric layer 102, and a portion of the substrate 100, but the disclosure is not limited thereto. As long as the trimming process TP1 can remove the edge defect ED1, it falls within the scope of the disclosure. In some embodiments, the trimming process TP1 is, for example, a grinding process. For instance, a grinder may be used to perform the trimming process TP1.

With reference to FIG. 1C, after the trimming process TP1 is performed, the wafer W2 may be subjected to a thinning process. In some embodiments, the thinning process may be performed on the substrate 108. In some embodiments, the thinning process is, for example, a grinding process, a chemical mechanical polishing (CMP) process, or a combination of the foregoing.

With reference to FIG. 1D, a passivation layer 118 may be formed on the wafer stack structure WS1. A material of the passivation layer 118 is, for example, silicon oxide, silicon nitride, silicon oxynitride (SiON), silicon carbide nitride (SiCN), or a combination of the foregoing. A method of forming the passivation layer 118 is, for example, an atomic layer deposition (ALD) method or a plasma-enhanced chemical vapor deposition (PECVD) method. In some embodiments, after the trimming process TP1 is performed, since the passivation layer 118 covers the wafer stack structure WS1, metal materials (not shown) in the dielectric layer 110 and the dielectric layer 102 may be prevented from being exposed, so that cross-contamination is prevented from occurring in subsequent processes. In some other embodiments, the passivation layer 118 may be omitted.

With reference to FIG. 1E, a portion of the wafer W2 may be removed to expose the through-substrate via 116. In some embodiments, a portion of the substrate 108 may be removed to expose the through-substrate via 116. The method for removing a portion of the wafer W2 is, for example, an etch-back method, such as a dry etching method. Besides, during the process of removing a portion of the wafer W2, a portion of the passivation layer 118 may be removed.

Next, a redistribution layer structure 120 may be formed on the wafer W2. The redistribution layer structure 120 may be electrically connected to the through-substrate via 116. In some embodiments, the redistribution layer structure 120 may include a dielectric layer 122 and a dielectric layer 124. The dielectric layer 122 is located on the wafer W2. A material of the dielectric layer 122 is, for example, silicon oxide, silicon nitride, silicon oxynitride, silicon carbide nitride, or a combination of the foregoing. The redistribution layer 124 is located in the dielectric layer 122. The redistribution layer 124 may be electrically connected to the through-substrate via 116. A material of the redistribution layer 124 is, for example, a conductive material such as copper. Further, the redistribution layer structure 120 may be fabricated by a conventional method, and description thereof is not repeated herein. Besides, a person having ordinary skill in the art can adjust the number of layers and configuration of the dielectric layer 122 and the redistribution layer 124 according to needs.

With reference to FIG. 1F, a wafer W3 may bonded to the wafer W2 to form a wafer stack structure WS2. In some embodiments, the wafer W3 may include a substrate 125, a dielectric layer 126, an interconnect structure 128, a bonding pad 130, and a through-substrate via 132. The substrate 125 may be a semiconductor substrate, such as a silicon substrate. The dielectric layer 126 is located on the substrate 125. Besides, although not shown in the figure, required semiconductor devices (e.g., active devices and/or passive devices) may be provided on the substrate 125. In some embodiments, the dielectric layer 126 may be a multilayer structure. A material of the dielectric layer 126 is, for example, silicon oxide, silicon nitride, or a combination of the foregoing. The interconnect structure 128 is located in the dielectric layer 126. A material of the interconnect structure 128 is, for example, copper, aluminum, tungsten, tantalum, tantalum nitride, titanium, titanium nitride, or a combination of the foregoing. Further, a person having ordinary skill in the art can adjust the number of layers and configuration of the interconnection structure 128 according to needs. The bonding pad 130 is located in the dielectric layer 126 and may be electrically connected to the interconnect structure 128. A material of the bonding pad 130 is, for example, a conductive material such as copper. The through-substrate via 132 is located in substrate 125 and may further be located in dielectric layer 126. The through-substrate via 132 may be electrically connected to the interconnect structure 128. A material of the through-substrate via 132 is, for example, copper, tantalum, tantalum nitride, or a combination of the foregoing.

In some embodiments, the method of bonding the wafer W3 to the wafer W2 includes a hybrid bonding method. For instance, the bonding pad 130 may be bonded to the redistribution layer 124, the dielectric layer 126 may be bonded to the dielectric layer 122, and the wafer W3 may be bonded to the wafer W2 through the hybrid bonding method, but the disclosure is not limited thereto.

Next, an edge defect inspection DI2 may be performed on the wafer stack structure WS2 to find an edge defect ED2 (e.g., a crack and/or a bubble) and measure a distance D2 in the radial direction between an edge of the wafer stack structure WS2 and an end of the edge defect ED2 away from the edge of the wafer stack structure WS2. In some embodiments, the edge defect ED2 may be located between the wafer W3 and the wafer W2. In some embodiments, the distance D2 is, for example, 1.8 millimeters to 3.3 millimeters. In some embodiments, a machine used for the edge defect inspection DI2 is, for example, a C-mode scanning acoustic microscope (CSAM).

With reference to FIG. 1G, a trimming process TP2 with a range of a width WD2 is performed from the edge of the wafer stack structure WS2 to remove the edge defect ED2. Herein, the width WD2 may be greater than or equal to the distance D2. In this way, the edge defect ED2 may be effectively removed, and the yield is thus further improved. In some embodiments, the trimming process TP2 may completely remove the edge defect ED2. The width WD2 of the trimming process TP2 may be greater than the width WD1 of the trimming process TP1. In some embodiments, the width WD2 is, for example, 1.8 millimeters to 3.3 millimeters. In some embodiments, the trimming process TP2 may remove a portion of the substrate 125, a portion of the dielectric layer 126, a portion of the redistribution layer structure 120, a portion of the passivation layer 118, a portion of the substrate 108, a portion of the dielectric layer 110, a portion of the dielectric layer 102, and a portion of the substrate 100, but the disclosure is not limited thereto. As long as the trimming process TP2 can remove the edge defect ED2, it falls within the scope of the disclosure. In some embodiments, the trimming process TP2 is, for example, a grinding process. For instance, a grinder may be used to perform the trimming process TP2.

With reference to FIG. 1H, after the trimming process TP2 is performed, the wafer W3 may be subjected to a thinning process. In some embodiments, the thinning process may be performed on the substrate 125. In some embodiments, the thinning process is, for example, a grinding process, a chemical mechanical polishing process, or a combination of the foregoing.

With reference to FIG. 1I, a passivation layer 134 may be formed on the wafer stack structure WS2. A material of the passivation layer 134 is, for example, silicon oxide, silicon nitride, silicon oxynitride, silicon carbide nitride, or a combination of the foregoing. A method of forming the passivation layer 134 is, for example, an atomic layer deposition method or a plasma-enhanced chemical vapor deposition method. In some embodiments, after the trimming process TP2 is performed, since the passivation layer 134 covers the wafer stack structure WS2, metal materials (not shown) in the dielectric layer 126, the dielectric layer 122, the dielectric layer 110, and the dielectric layer 102 may be prevented from being exposed, so that cross-contamination is prevented from occurring in subsequent processes. In some other embodiments, the passivation layer 134 may be omitted.

With reference to FIG. 1J, a portion of the wafer W3 may be removed to expose the through-substrate via 132. In some embodiments, a portion of the substrate 125 may be removed to expose the through-substrate via 132. The method for removing a portion of the wafer W3 is, for example, an etch-back method, such as a dry etching method. Besides, during the process of removing a portion of the wafer W3, a portion of the passivation layer 134 may be removed.

Next, a redistribution layer structure 136 may be formed on the wafer W3. The redistribution layer structure 136 may be electrically connected to the through-substrate via 132. In some embodiments, the redistribution layer structure 136 may include a dielectric layer 138 and a dielectric layer 140. The dielectric layer 138 is located on the wafer W3. A material of the dielectric layer 138 is, for example, silicon oxide, silicon nitride, silicon oxynitride, silicon carbide nitride, or a combination of the foregoing. The redistribution layer 140 is located in the dielectric layer 138. The redistribution layer 140 may be electrically connected to the through-substrate via 132. A material of the redistribution layer 140 is, for example, a conductive material such as copper. Further, the redistribution layer structure 136 may be fabricated by a conventional method, and description thereof is not repeated herein. Besides, a person having ordinary skill in the art can adjust the number of layers and configuration of the dielectric layer 138 and the redistribution layer 140 according to needs.

With reference to FIG. 1K, a wafer W4 may bonded to the wafer W3 to form a wafer stack structure WS3. In some embodiments, the wafer W4 may include a substrate 142, a dielectric layer 144, an interconnect structure 146, a bonding pad 148, and a through-substrate via 150. The substrate 142 may be a semiconductor substrate, such as a silicon substrate. The dielectric layer 144 is located on the substrate 142. Besides, although not shown in the figure, required semiconductor devices (e.g., active devices and/or passive devices) may be provided on the substrate 142. In some embodiments, the dielectric layer 144 may be a multilayer structure. A material of the dielectric layer 144 is, for example, silicon oxide, silicon nitride, or a combination of the foregoing. The interconnect structure 146 is located in the dielectric layer 144. A material of the interconnect structure 146 is, for example, copper, aluminum, tungsten, tantalum, tantalum nitride, titanium, titanium nitride, or a combination of the foregoing. Further, a person having ordinary skill in the art can adjust the number of layers and configuration of the interconnection structure 146 according to needs. The bonding pad 148 is located in the dielectric layer 144 and may be electrically connected to the interconnect structure 146. A material of the bonding pad 148 is, for example, a conductive material such as copper. The through-substrate via 150 is located in substrate 142 and may further be located in dielectric layer 144. The through-substrate via 150 may be electrically connected to the interconnect structure 146. A material of the through-substrate via 150 is, for example, copper, tantalum, tantalum nitride, or a combination of the foregoing.

In some embodiments, the method of bonding the wafer W4 to the wafer W3 includes a hybrid bonding method. For instance, the bonding pad 148 may be bonded to the redistribution layer 140, the dielectric layer 144 may be bonded to the dielectric layer 138, and the wafer W4 may be bonded to the wafer W3 through the hybrid bonding method, but the disclosure is not limited thereto.

Next, an edge defect inspection DI3 may be performed on the wafer stack structure WS3 to find an edge defect ED3 (e.g., a crack and/or a bubble) and measure a distance D3 in the radial direction between an edge of the wafer stack structure WS3 and an end of the edge defect ED3 away from the edge of the wafer stack structure WS3. In some embodiments, the edge defect ED3 may be located between the wafer W4 and the wafer W3. In some embodiments, the distance D3 is, for example, 2.6 millimeters to 4.1 millimeters. In some embodiments, a machine used for the edge defect inspection DI3 is, for example, a C-mode scanning acoustic microscope (CSAM).

With reference to FIG. 1L, a trimming process TP3 with a range of a width WD3 is performed from the edge of the wafer stack structure WS3 to remove the edge defect ED3. Herein, the width WD3 may be greater than or equal to the distance D3. In this way, the edge defect ED3 may be effectively removed, and the yield is thus further improved. In some embodiments, the trimming process TP3 may completely remove the edge defect ED3. The width WD3 of the trimming process TP2 may be greater than the width WD2 of the trimming process TP2. In some embodiments, the width WD3 is, for example, 2.6 millimeters to 4.1 millimeters. In some embodiments, the trimming process TP3 may remove a portion of the substrate 142, a portion of the dielectric layer 144, a portion of the redistribution layer structure 136, a portion of the passivation layer 134, a portion of the substrate 125, a portion of the dielectric layer 126, a portion of the redistribution layer structure 120, a portion of the substrate 108, a portion of the dielectric layer 110, a portion of the dielectric layer 102, and a portion of the substrate 100, but the disclosure is not limited thereto. As long as the trimming process TP3 can remove the edge defect ED3, it falls within the scope of the disclosure. In some embodiments, the trimming process TP3 is, for example, a grinding process. For instance, a grinder may be used to perform the trimming process TP3.

With reference to FIG. 1M, after the trimming process TP3 is performed, the wafer W4 may be subjected to a thinning process. In some embodiments, the thinning process may be performed on the substrate 142. In some embodiments, the thinning process is, for example, a grinding process, a chemical mechanical polishing process, or a combination of the foregoing.

With reference to FIG. 1N, a passivation layer 152 may be formed on the wafer stack structure WS3. A material of the passivation layer 152 is, for example, silicon oxide, silicon nitride, silicon oxynitride, silicon carbide nitride, or a combination of the foregoing. A method of forming the passivation layer 152 is, for example, an atomic layer deposition method or a plasma-enhanced chemical vapor deposition method. In some embodiments, after the trimming process TP3 is performed, since the passivation layer 152 covers the wafer stack structure WS3, metal materials (not shown) in the dielectric layer 144, the dielectric layer 138, the dielectric layer 126, the dielectric layer 122, the dielectric layer 110, and the dielectric layer 102 may be prevented from being exposed, so that cross-contamination is prevented from occurring in subsequent processes. In some other embodiments, the passivation layer 152 may be omitted.

With reference to FIG. 1O, a portion of the wafer W4 may be removed to expose the through-substrate via 150. In some embodiments, a portion of the substrate 142 may be removed to expose the through-substrate via 150. The method for removing a portion of the wafer W4 is, for example, an etch-back method, such as a dry etching method. Besides, during the process of removing a portion of the wafer W4, a portion of the passivation layer 152 may be removed.

Next, a redistribution layer structure 154 may be formed on the wafer W4. The redistribution layer structure 154 may be electrically connected to the through-substrate via 150. In some embodiments, the redistribution layer structure 154 may include a dielectric layer 156 and a dielectric layer 158. The dielectric layer 156 is located on the wafer W4. A material of the dielectric layer 156 is, for example, silicon oxide, silicon nitride, silicon oxynitride, silicon carbide nitride, or a combination of the foregoing. The redistribution layer 158 is located in the dielectric layer 156. A material of the redistribution layer 158 is, for example, a conductive material such as copper. The redistribution layer 158 may be electrically connected to the through-substrate via 150. Further, the redistribution layer structure 154 may be fabricated by a conventional method, and description thereof is not repeated herein. Besides, a person having ordinary skill in the art can adjust the number of layers and configuration of the dielectric layer 156 and the redistribution layer 158 according to needs.

In this embodiment, adjacent two of the wafers W1 to W4 may be bonded by a hybrid bonding method, but the disclosure is not limited thereto. In some other embodiments, adjacent two of the wafers W1 to W4 may be bonded by a fusion bonding method, but description thereof is omitted herein.

Based on the foregoing embodiments, it can be seen that in the wafer stacking method, the edge defect inspection DI1 is performed on the wafer stack structure WS1 including the wafer W1 and the wafer W2 to find the edge defect ED1 (e.g., a crack and/or a bubble) and measure the distance D1 in the radial direction between the edge of the wafer stack structure WS1 and the end of the edge defect ED1 away from the edge of the wafer stack structure WS1. Next, the trimming process TP1 with the range of the width WD1 is performed from the edge of the wafer stack structure WS1 to remove the edge defect ED1. Herein, the width WD1 is greater than or equal to the distance D1. In this way, through the wafer stacking method, the edge defect ED1 may be effectively removed, and the yield is thus further improved.

FIG. 2A to FIG. 2K are cross-sectional views of the wafer stacking method according to some other embodiments of the disclosure.

Figure 2A:
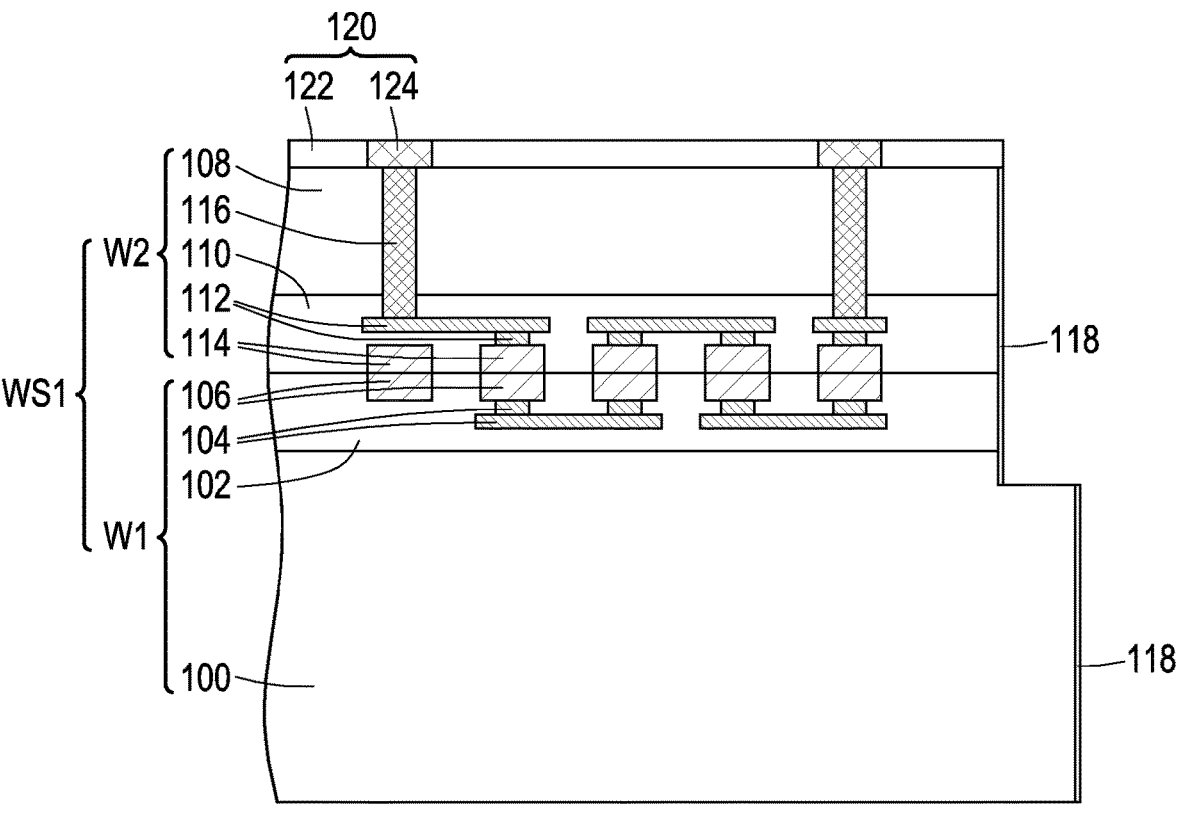
FIG. 2A to FIG. 2K are cross-sectional views of the wafer stacking method according to some other embodiments of the disclosure.

With reference to FIG. 2A, a structure as shown in FIG. 1E is provided. In addition, for details of the structure of FIG. 1E, reference may be made to the descriptions of FIG. 1A to FIG. 1E, which will not be repeated herein.

Figure 2B:
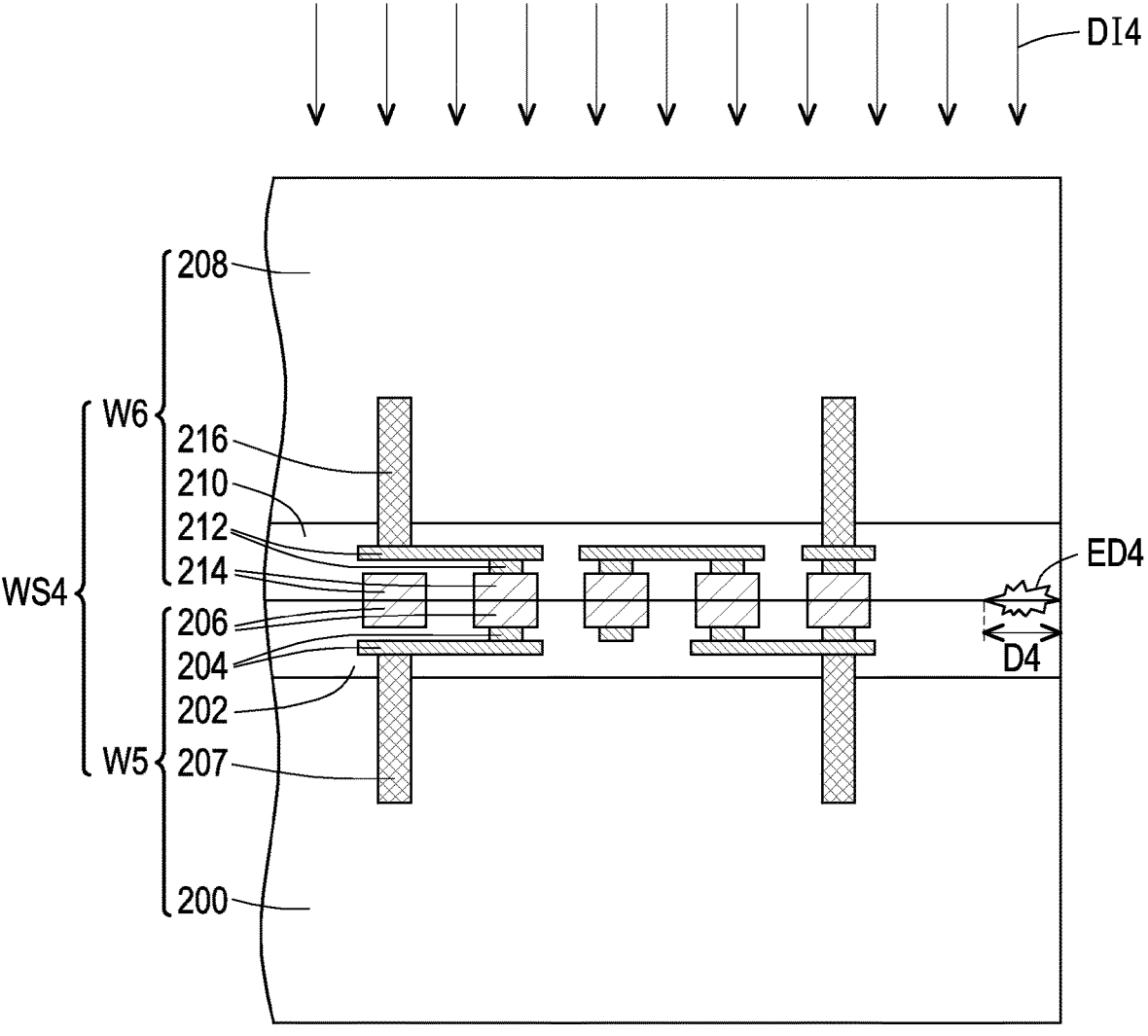

With reference to FIG. 2B, a wafer W5 may be provided. In some embodiments, the wafer W5 may include a substrate 200, a dielectric layer 202, an interconnect structure 204, a bonding pad 206, and a through-substrate via 207. The substrate 200 may be a semiconductor substrate, such as a silicon substrate. The dielectric layer 202 is located on the substrate 200. Besides, although not shown in the figure, required semiconductor devices (e.g., active devices and/or passive devices) may be provided on the substrate 200. In some embodiments, the dielectric layer 202 may be a multilayer structure. A material of the dielectric layer 202 is, for example, silicon oxide, silicon nitride, or a combination of the foregoing. The interconnect structure 204 is located in the dielectric layer 202. A material of the interconnect structure 204 is, for example, copper, aluminum, tungsten, tantalum, tantalum nitride, titanium, titanium nitride, or a combination of the foregoing. Further, a person having ordinary skill in the art can adjust the number of layers and configuration of the interconnection structure 204 according to needs. The bonding pad 206 is located in the dielectric layer 202 and may be electrically connected to the interconnect structure 204. A material of the bonding pad 206 is, for example, a conductive material such as copper. The through-substrate via 207 is located in substrate 200 and may further be located in dielectric layer 202. The through-substrate via 207 may be electrically connected to the interconnect structure 204. A material of the through-substrate via 207 is, for example, copper, tantalum, tantalum nitride, or a combination of the foregoing.

Next, a wafer W6 is bonded to the wafer W5 to form a wafer stack structure WS4. In some embodiments, the wafer W6 may include a substrate 208, a dielectric layer 210, an interconnect structure 212, a bonding pad 214, and a through-substrate via 216. The substrate 208 may be a semiconductor substrate, such as a silicon substrate. The dielectric layer 210 is located on the substrate 208. Besides, although not shown in the figure, required semiconductor devices (e.g., active devices and/or passive devices) may be provided on the substrate 208. In some embodiments, the dielectric layer 210 may be a multilayer structure. A material of the dielectric layer 210 is, for example, silicon oxide, silicon nitride, or a combination of the foregoing. The interconnect structure 212 is located in the dielectric layer 210. A material of the interconnect structure 212 is, for example, copper, aluminum, tungsten, tantalum, tantalum nitride, titanium, titanium nitride, or a combination of the foregoing. Further, a person having ordinary skill in the art can adjust the number of layers and configuration of the interconnection structure 212 according to needs. The bonding pad 214 is located in the dielectric layer 210 and may be electrically connected to the interconnect structure 212. A material of the bonding pad 214 is, for example, a conductive material such as copper. The through-substrate via 216 is located in substrate 208 and may further be located in dielectric layer 210. The through-substrate via 216 may be electrically connected to the interconnect structure 212. A material of the through-substrate via 216 is, for example, copper, tantalum, tantalum nitride, or a combination of the foregoing.

In some embodiments, the method of bonding the wafer W6 to the wafer W5 includes a hybrid bonding method. For instance, the bonding pad 214 may be bonded to the bonding pad 206, the dielectric layer 210 may be bonded to the dielectric layer 202, and the wafer W6 may be bonded to the wafer W5 through the hybrid bonding method, but the disclosure is not limited thereto.

Next, an edge defect inspection DI4 may be performed on the wafer stack structure WS4 to find an edge defect ED4 (e.g., a crack and/or a bubble) and measure a distance D4 in the radial direction between an edge of the wafer stack structure WS4 and an end of the edge defect ED4 away from the edge of the wafer stack structure WS4. In some embodiments, the edge defect ED4 may be located between the wafer W6 and the wafer W5. In some embodiments, the distance D4 is, for example, 1 millimeter to 2.5 millimeters. In some embodiments, a machine used for the edge defect inspection DI4 is, for example, a C-mode scanning acoustic microscope (CSAM).

Figure 2C:
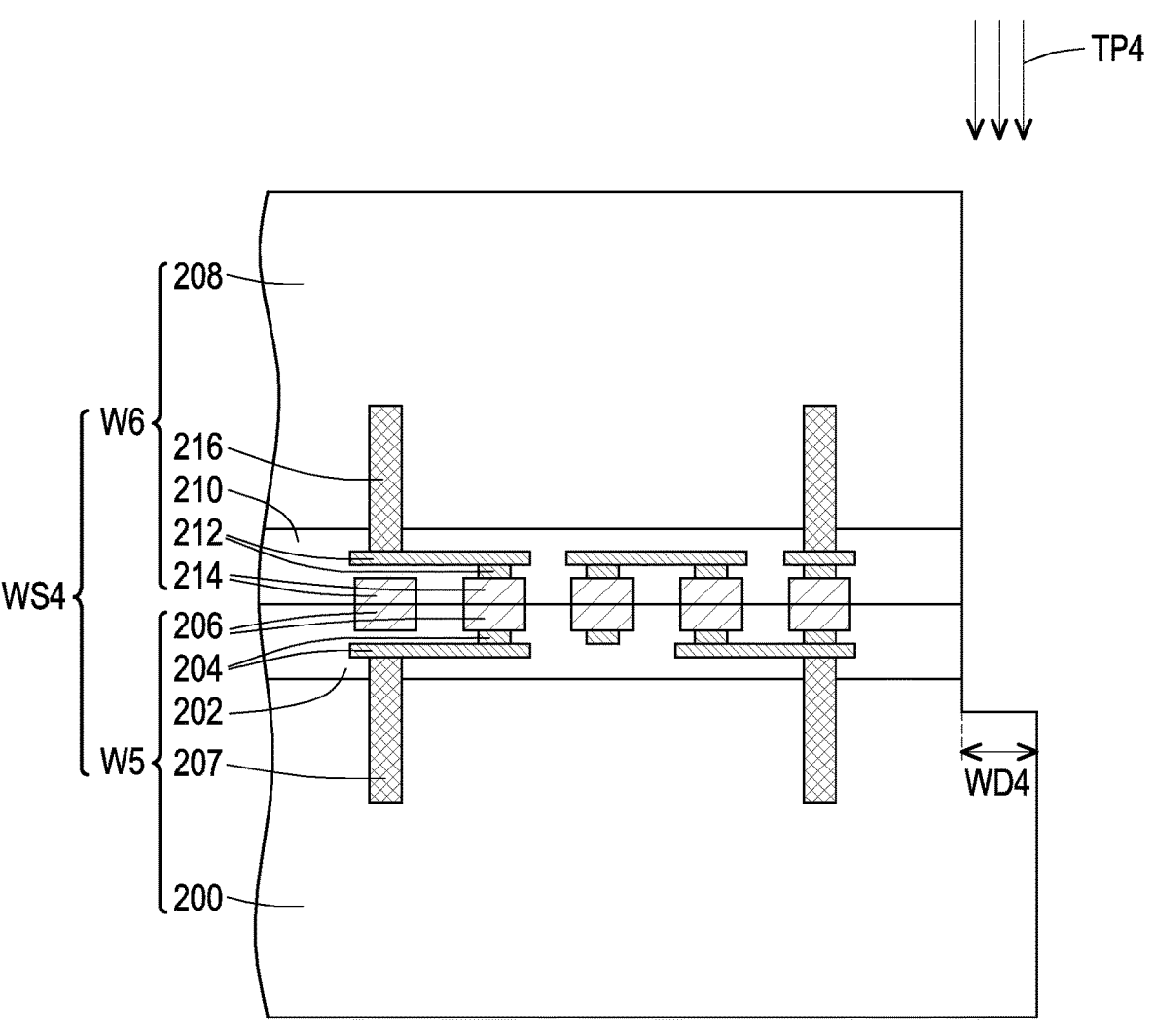

With reference to FIG. 2C, a trimming process TP4 with a range of a width WD4 is performed from the edge of the wafer stack structure WS4 to remove the edge defect ED4. Herein, the width WD4 may be greater than or equal to the distance D4. In this way, the edge defect ED4 may be effectively removed, and the yield is thus further improved. In some embodiments, the trimming process TP4 may completely remove the edge defect ED4. In some embodiments, the width WD4 is, for example, 1 millimeter to 2.5 millimeters. In some embodiments, the width WD1 of the trimming process TP1 and the width WD4 of the trimming process TP4 may be the same width. In some other embodiments, the width WD1 of the trimming process TP1 and the width WD4 of the trimming process TP4 may be different widths. In some embodiments, the trimming process TP4 may remove a portion of the substrate 208, a portion of the dielectric layer 210, a portion of the dielectric layer 202, and a portion of the substrate 200, but the disclosure is not limited thereto. As long as the trimming process TP4 can remove the edge defect ED4, it falls within the scope of the disclosure. In some embodiments, the trimming process TP4 is, for example, a grinding process. For instance, a grinder may be used to perform the trimming process TP4.

Figure 2D:
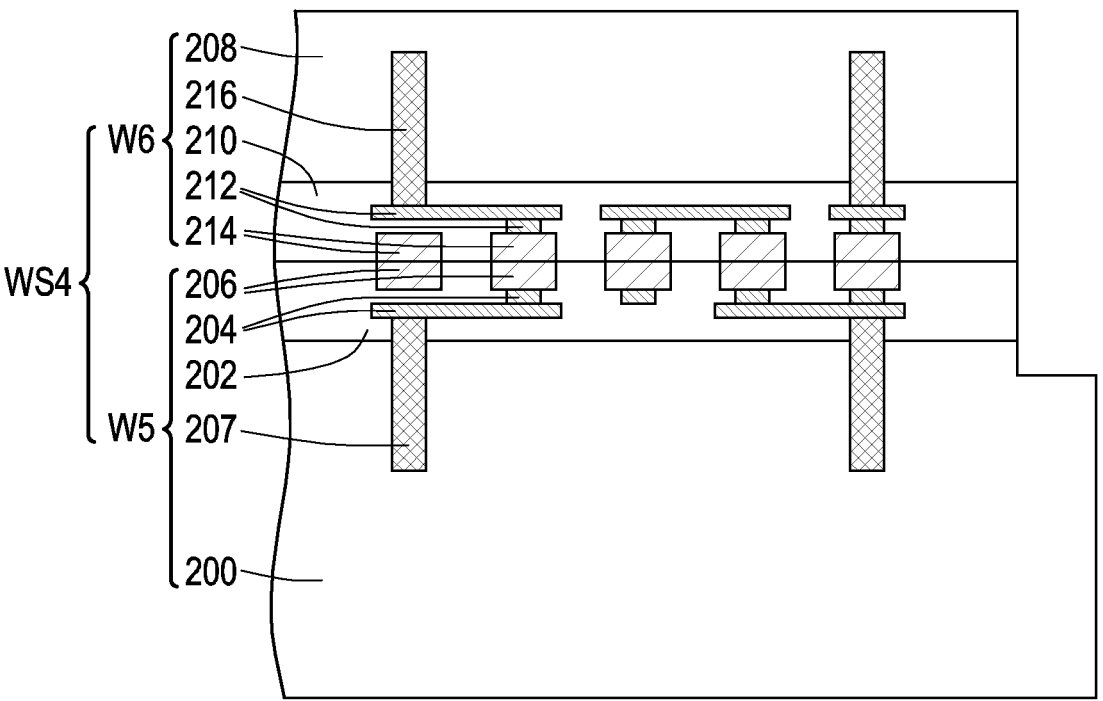

With reference to FIG. 2D, after the trimming process TP4 is performed, the wafer W6 may be subjected to a thinning process. In some embodiments, the thinning process may be performed on the substrate 208. In some embodiments, the thinning process is, for example, a grinding process, a chemical mechanical polishing process, or a combination of the foregoing.

Figure 2E:
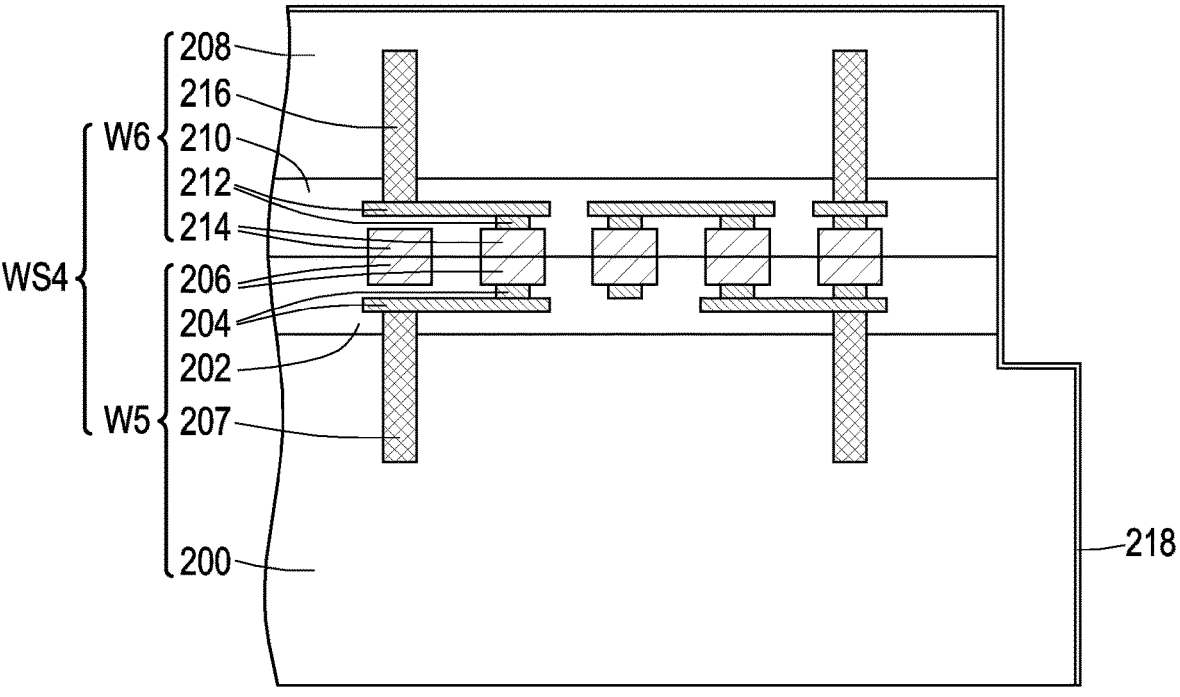

With reference to FIG. 2E, a passivation layer 218 may be formed on the wafer stack structure WS4. A material of the passivation layer 218 is, for example, silicon oxide, silicon nitride, silicon oxynitride, silicon carbide nitride, or a combination of the foregoing. A method of forming the passivation layer 218 is, for example, an atomic layer deposition method or a plasma-enhanced chemical vapor deposition method. In some embodiments, after the trimming process TP4 is performed, since the passivation layer 218 covers the wafer stack structure WS4, metal materials (not shown) in the dielectric layer 210 and the dielectric layer 202 may be prevented from being exposed, so that cross-contamination is prevented from occurring in subsequent processes. In some other embodiments, the passivation layer 218 may be omitted.

Figure 2F:
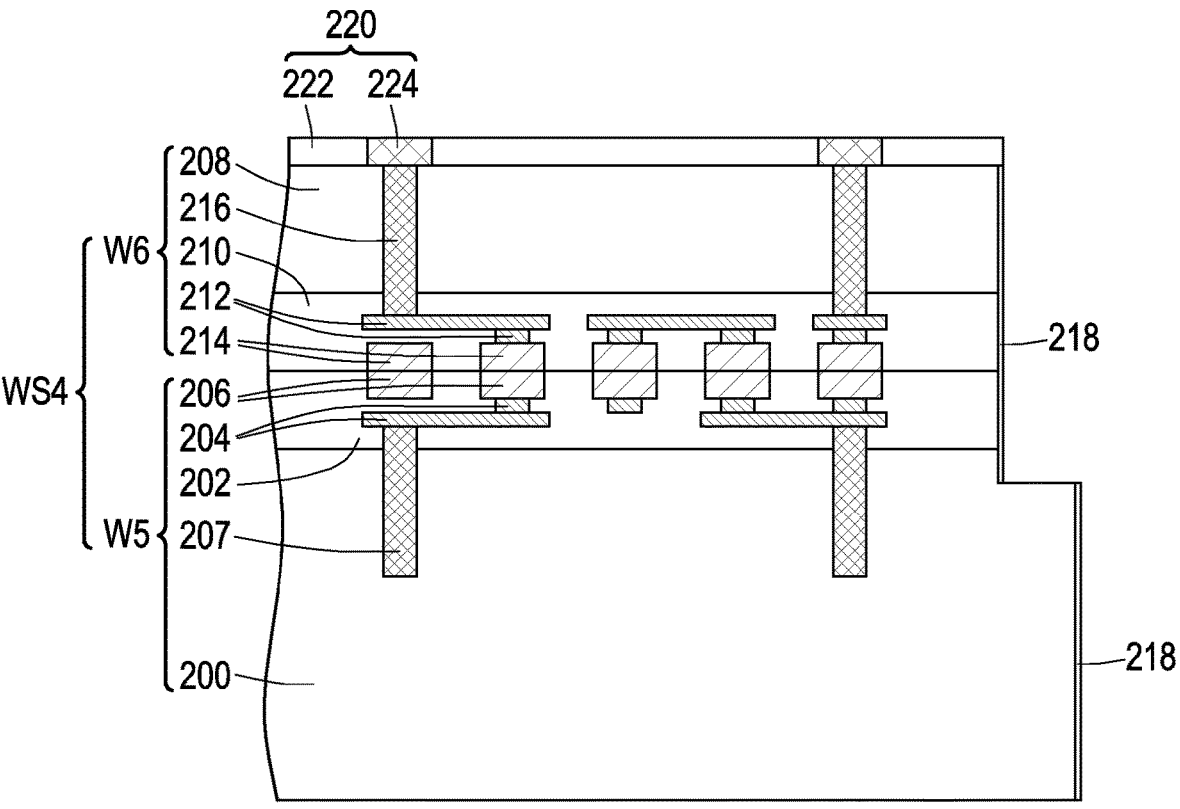

With reference to FIG. 2F, a portion of the wafer W6 may be removed to expose the through-substrate via 216. In some embodiments, a portion of the substrate 208 may be removed to expose the through-substrate via 216. The method for removing a portion of the wafer W6 is, for example, an etch-back method, such as a dry etching method. Besides, during the process of removing a portion of the wafer W6, a portion of the passivation layer 218 may be removed.

Next, a redistribution layer structure 220 may be formed on the wafer W6. The redistribution layer structure 220 may be electrically connected to the through-substrate via 216. In some embodiments, the redistribution layer structure 220 may include a dielectric layer 222 and a dielectric layer 224. The dielectric layer 222 is located on the wafer W6. A material of the dielectric layer 222 is, for example, silicon oxide, silicon nitride, silicon oxynitride, silicon carbide nitride, or a combination of the foregoing. The redistribution layer 224 is located in the dielectric layer 222. The redistribution layer 224 may be electrically connected to the through-substrate via 216. A material of the redistribution layer 224 is, for example, a conductive material such as copper. Further, the redistribution layer structure 220 may be fabricated by a conventional method, and description thereof is not repeated herein. Besides, a person having ordinary skill in the art can adjust the number of layers and configuration of the dielectric layer 222 and the redistribution layer 224 according to needs.

Figure 2G:
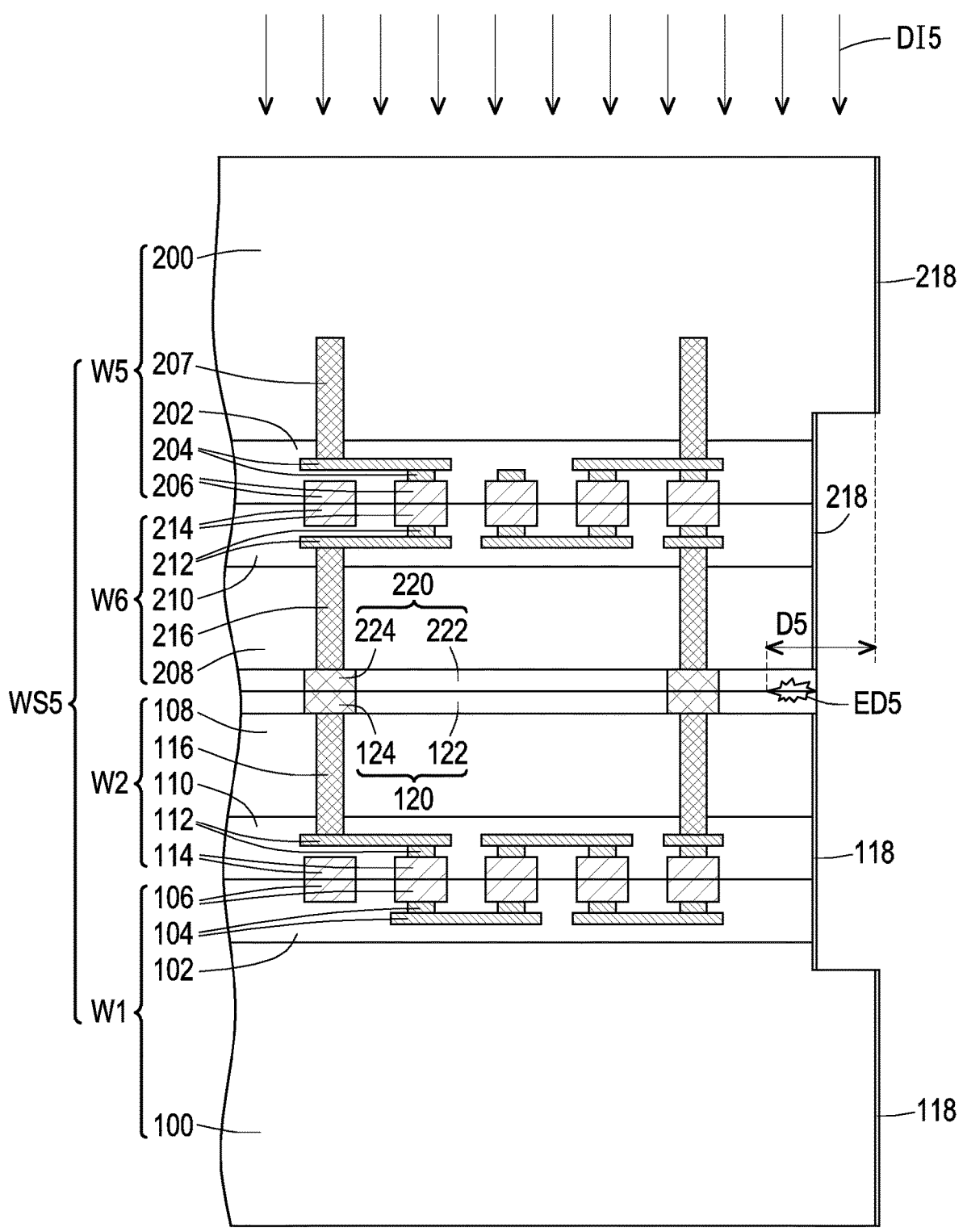

With reference to FIG. 2G, the wafer W6 may bonded to the wafer W2 to form a wafer stack structure WS5. In some embodiments, the method of bonding the wafer W6 to the wafer W2 includes a hybrid bonding method. For instance, the redistribution layer 224 may be bonded to the redistribution layer 124, the dielectric layer 222 may be bonded to the dielectric layer 122, and the wafer W6 may be bonded to the wafer W2 through the hybrid bonding method, but the disclosure is not limited thereto.

Next, an edge defect inspection DI5 may be performed on the wafer stack structure WS5 to find an edge defect ED5 (e.g., a crack and/or a bubble) and measure a distance D5 in the radial direction between an edge of the wafer stack structure WS5 and an end of the edge defect ED5 away from the edge of the wafer stack structure WS5. In some embodiments, the edge defect ED5 may be located between the wafer W6 and the wafer W2. In some embodiments, the distance D5 is, for example, 1.8 millimeters to 3.3 millimeters. In some embodiments, a machine used for the edge defect inspection DI5 is, for example, a C-mode scanning acoustic microscope (CSAM).

Figure 2H:
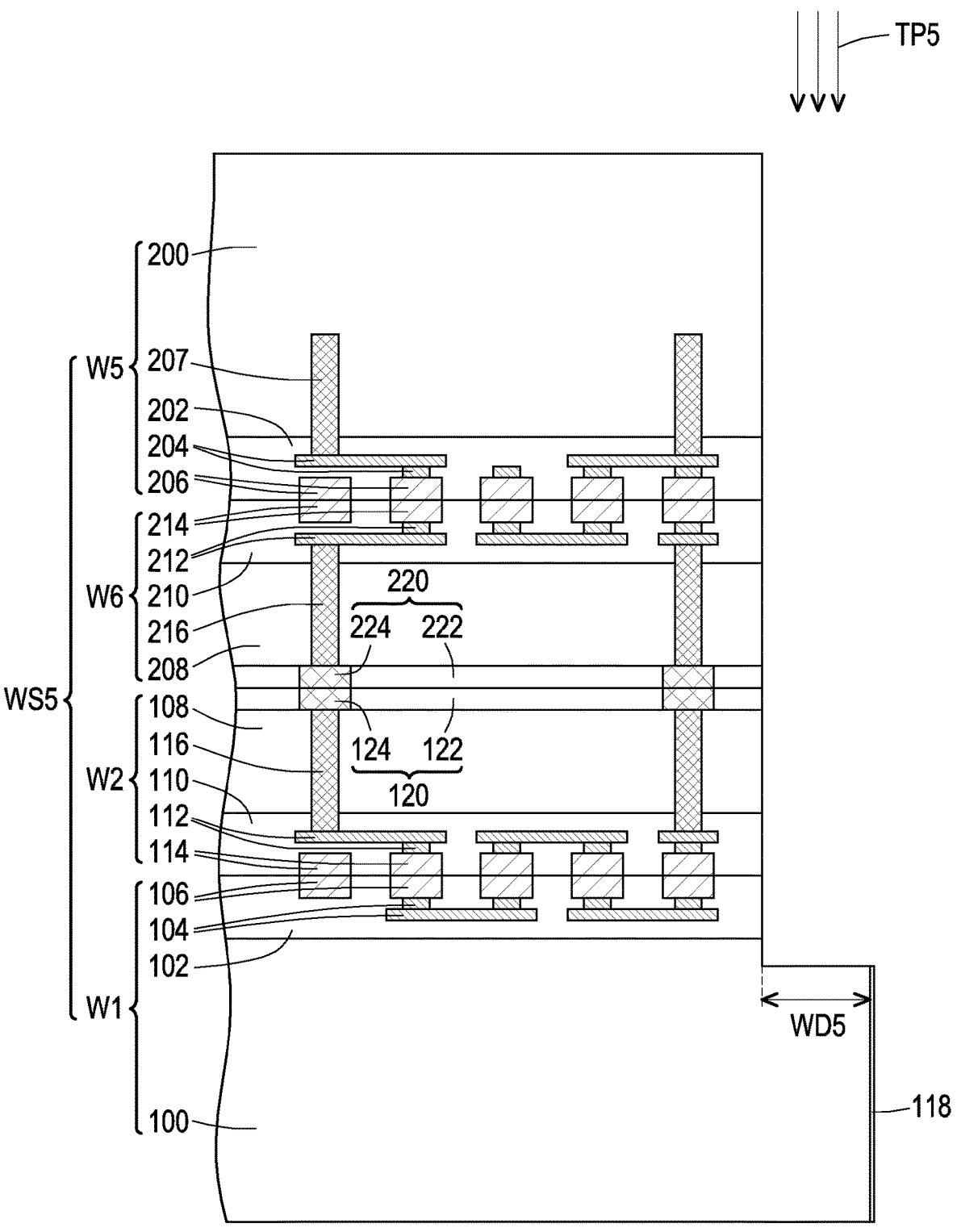

With reference to FIG. 2H, a trimming process TP5 with a range of a width WD5 is performed from the edge of the wafer stack structure WS5 to remove the edge defect ED5. Herein, the width WD5 may be greater than or equal to the distance D5. In this way, the edge defect ED5 may be effectively removed, and the yield is thus further improved. In some embodiments, the trimming process TP5 may completely remove the edge defect ED5. The width WD5 of the trimming process TP5 may be greater than the width WD1 of the trimming process TP1 and the width WD4 of the trimming process TP4. In some embodiments, the width WD5 is, for example, 1.8 millimeters to 3.3 millimeters. In some embodiments, the trimming process TP5 may remove a portion of the substrate 200, a portion of the dielectric layer 202, a portion of the dielectric layer 210, a portion of the substrate 208, a portion of the passivation layer 218, a portion of the redistribution layer structure 220, a portion of the redistribution layer structure 120, a portion of the passivation layer 118, a portion of the substrate 108, a portion of the dielectric layer 110, a portion of the dielectric layer 102, and a portion of the substrate 100, but the disclosure is not limited thereto. As long as the trimming process TP5 can remove the edge defect ED5, it falls within the scope of the disclosure. In some embodiments, the trimming process TP5 is, for example, a grinding process. For instance, a grinder may be used to perform the trimming process TP5.

Figure 2I:
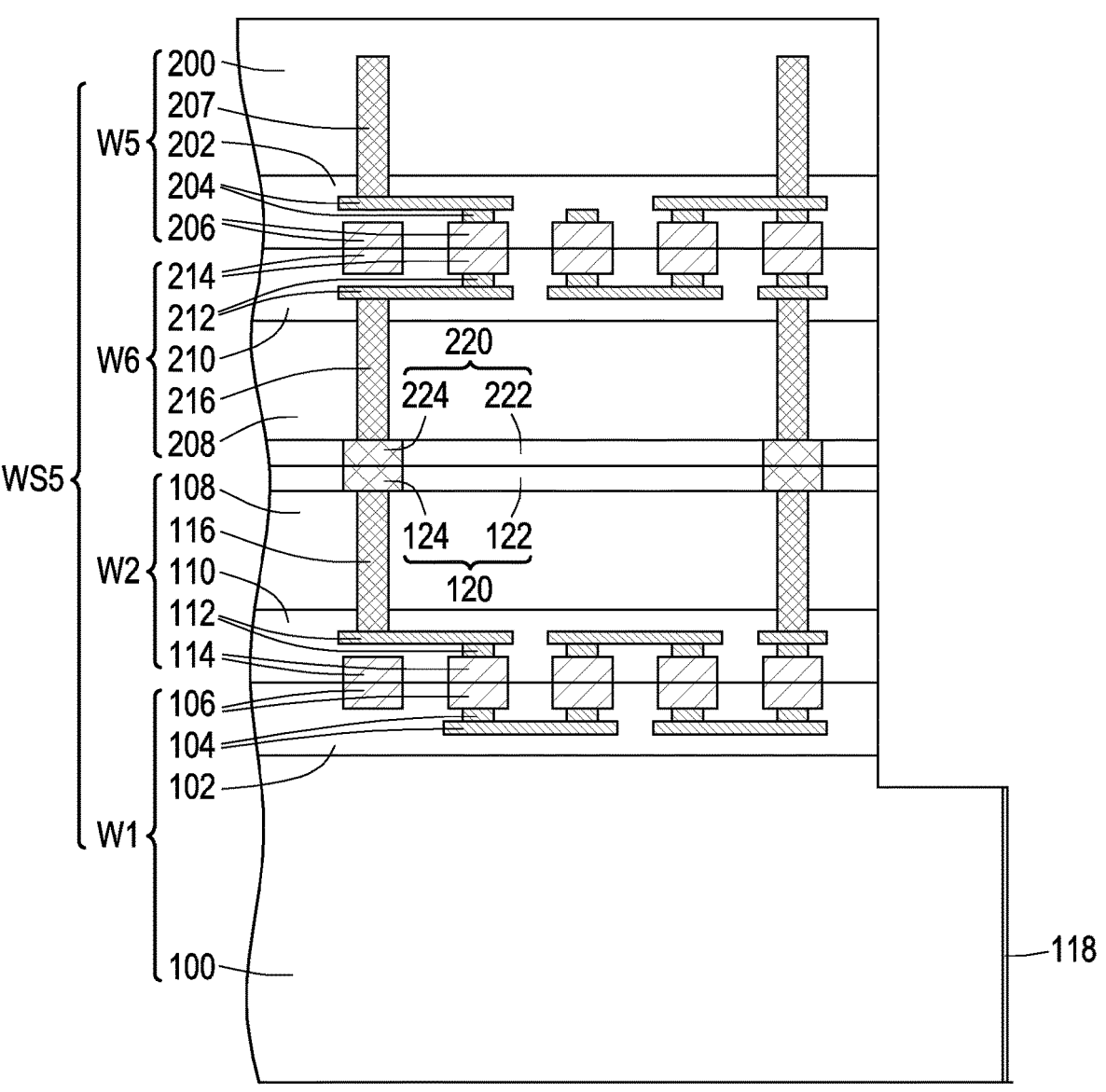

With reference to FIG. 2I, after the trimming process TP5 is performed, the wafer W5 may be subjected to a thinning process. In some embodiments, the thinning process may be performed on the substrate 200. In some embodiments, the thinning process is, for example, a grinding process, a chemical mechanical polishing process, or a combination of the foregoing.

Figure 2J:
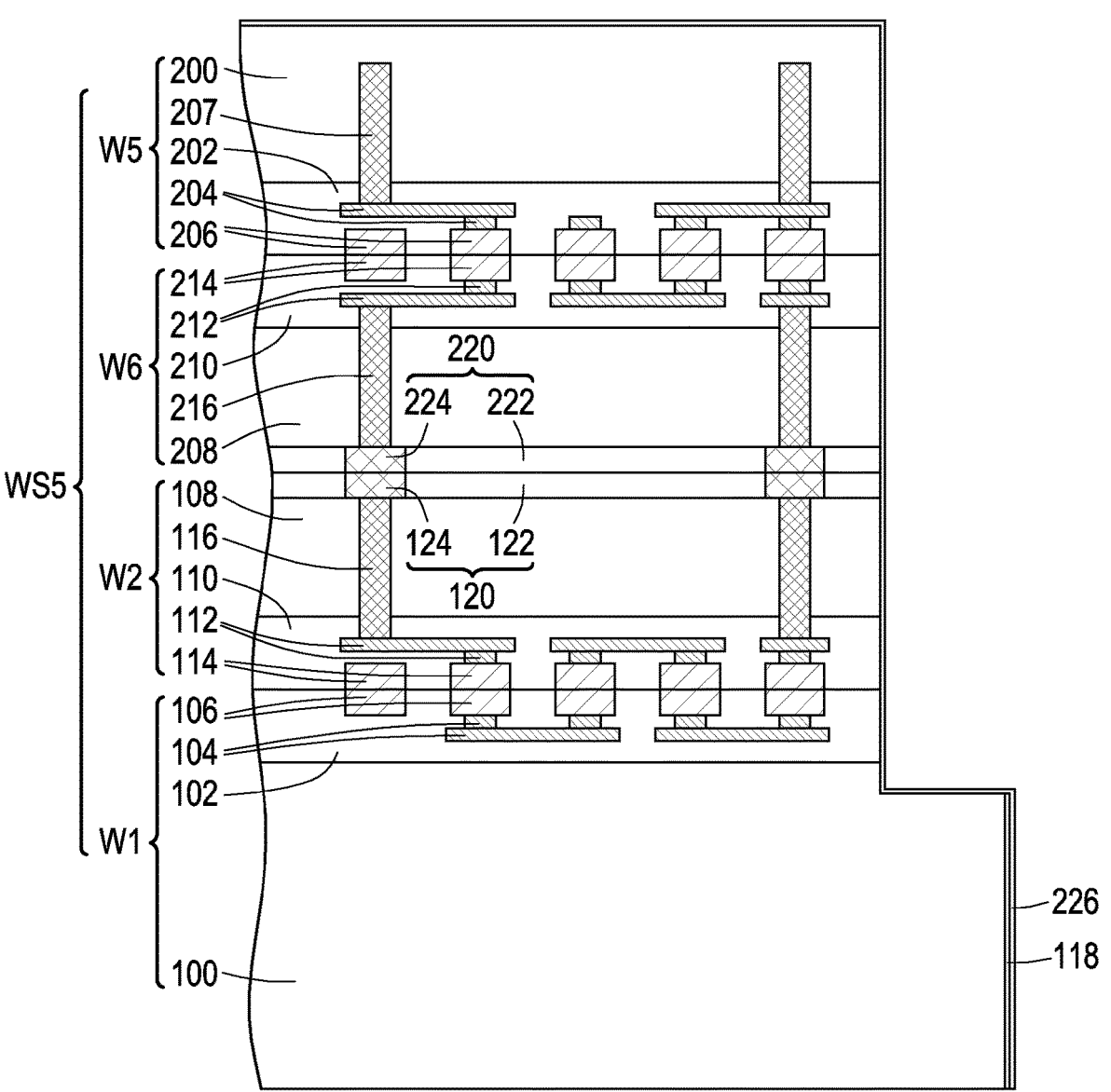

With reference to FIG. 2J, a passivation layer 226 may be formed on the wafer stack structure WS5. A material of the passivation layer 226 is, for example, silicon oxide, silicon nitride, silicon oxynitride, silicon carbide nitride, or a combination of the foregoing. A method of forming the passivation layer 226 is, for example, an atomic layer deposition method or a plasma-enhanced chemical vapor deposition method. In some embodiments, after the trimming process TP5 is performed, since the passivation layer 226 covers the wafer stack structure WS5, metal materials (not shown) in the dielectric layer 202, the dielectric layer 210, the dielectric layer 222, the dielectric layer 122, the dielectric layer 110, and the dielectric layer 102 may be prevented from being exposed, so that cross-contamination is prevented from occurring in subsequent processes. In some other embodiments, the passivation layer 226 may be omitted.

Figure 2K:
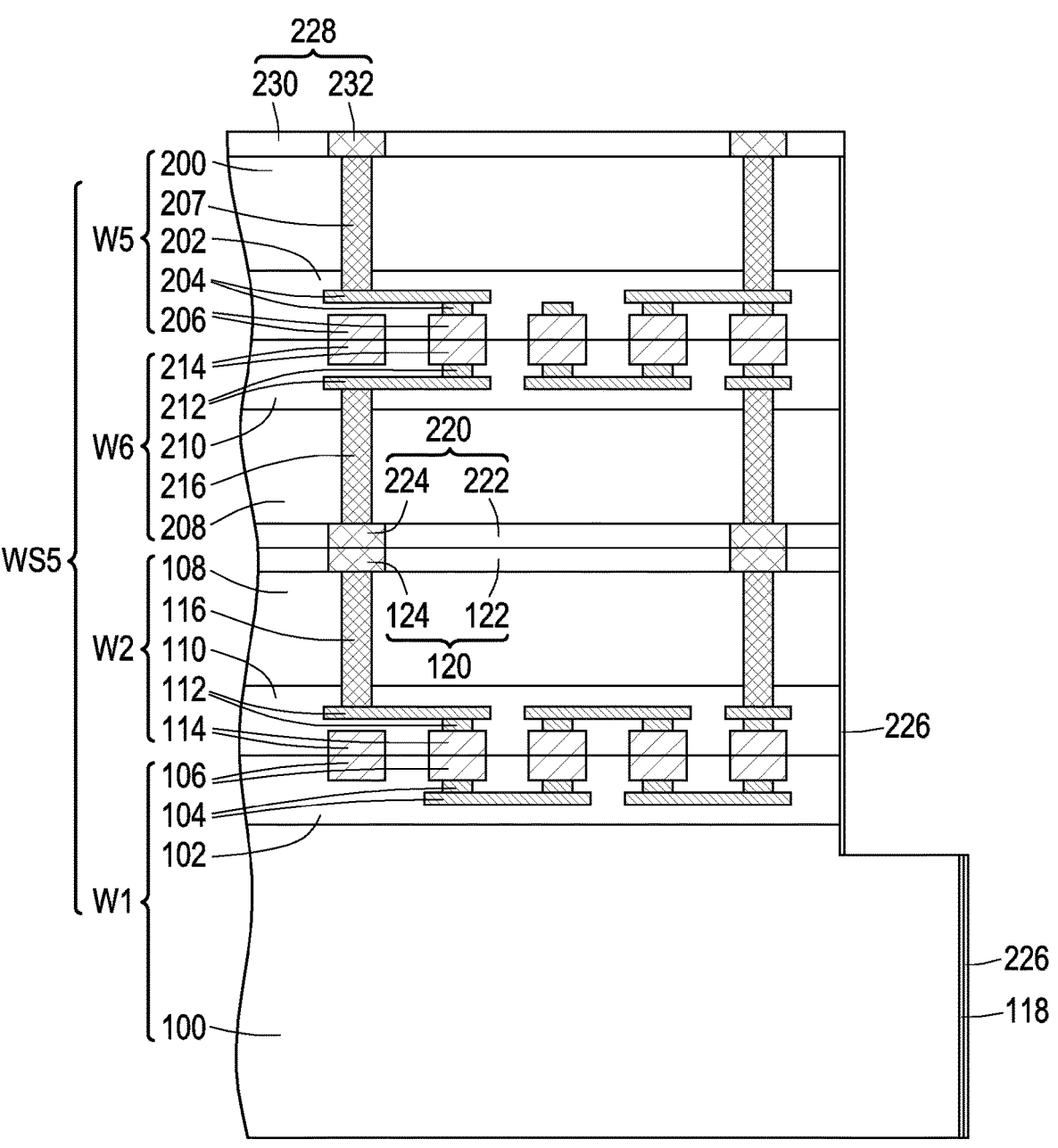

With reference to FIG. 2K, a portion of the wafer W5 may be removed to expose the through-substrate via 207. In some embodiments, a portion of the substrate 200 may be removed to expose the through-substrate via 207. The method for removing a portion of the wafer W5 is, for example, an etch-back method, such as a dry etching method. Besides, during the process of removing a portion of the wafer W5, a portion of the passivation layer 226 may be removed.

Next, a redistribution layer structure 228 may be formed on the wafer W5. The redistribution layer structure 228 may be electrically connected to the through-substrate via 207. In some embodiments, the redistribution layer structure 228 may include a dielectric layer 230 and a dielectric layer 232. The dielectric layer 230 is located on the wafer W5. A material of the dielectric layer 230 is, for example, silicon oxide, silicon nitride, silicon oxynitride, silicon carbide nitride, or a combination of the foregoing. The redistribution layer 232 is located in the dielectric layer 230. The redistribution layer 232 may be electrically connected to the through-substrate via 207. A material of the redistribution layer 232 is, for example, a conductive material such as copper. Further, the redistribution layer structure 228 may be fabricated by a conventional method, and description thereof is not repeated herein. Besides, a person having ordinary skill in the art can adjust the number of layers and configuration of the dielectric layer 230 and the redistribution layer 232 according to needs.

In this embodiment, adjacent two of the wafer W1, wafer W2, wafer W5, and wafer W6 may be bonded by a hybrid bonding method, but the disclosure is not limited thereto. In some other embodiments, adjacent two of the wafer W1, wafer W2, wafer W5, and wafer W6 may be bonded by a fusion bonding method, but description thereof is omitted herein.

In view of the foregoing, the wafer stacking method provided by the embodiments includes the edge defect inspections and the trimming processes. As such, an edge defect (e.g., a crack and/or a bubble) may be effectively removed, and the yield may thus be further improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A wafer stacking method, comprising:

providing a first wafer;

bonding a second wafer to the first wafer to form a first wafer stack structure;

performing a first edge defect inspection on the first wafer stack structure to find a first edge defect and measure a first distance in a radial direction between an edge of the first wafer stack structure and an end of the first edge defect away from the edge of the first wafer stack structure;

performing a first trimming process with a range of a first width from the edge of the first wafer stack structure to remove the first edge defect, wherein the first width is greater than or equal to the first distance; and performing a thinning process on the second wafer after the first trimming process is performed, wherein the second wafer comprises a first through-substrate via, and the wafer stacking method further comprises:

removing a portion of the second wafer to expose the first through-substrate via; and forming a redistribution layer structure on the second wafer, wherein the redistribution layer structure is electrically connected to the first through-substrate via.

2. The wafer stacking method according to claim 1, wherein a machine used for the first edge defect inspection comprises a C-mode scanning acoustic microscope.

3. The wafer stacking method according to claim 1, further comprising:

forming a passivation layer on the first wafer stack structure after the first trimming process is performed and before the first through-substrate via is exposed.

4. The wafer stacking method according to claim 1, further comprising:

bonding a third wafer to the second wafer to form a second wafer stack structure;

performing a second edge defect inspection on the second wafer stack structure to find a second edge defect and measure a second distance in the radial direction between an edge of the second wafer stack structure and an end of the second edge defect away from the edge of the second wafer stack structure; and performing a second trimming process with a range of a second width from the edge of the second wafer stack structure to remove the second edge defect, wherein the second width is greater than or equal to the second distance.

5. The wafer stacking method according to claim 4, wherein the second width is greater than the first width.

6. The wafer stacking method according to claim 4, further comprising:

performing a thinning process on the third wafer after the second trimming process is performed.

7. The wafer stacking method according to claim 6, wherein the third wafer comprises a second through-substrate via, and the wafer stacking method further comprises:

removing a portion of the third wafer to expose the second through-substrate via; and forming a redistribution layer structure on the third wafer, wherein the redistribution layer structure is electrically connected to the second through-substrate via.

8. The wafer stacking method according to claim 7, further comprising:

forming a passivation layer on the second wafer stack structure after the second trimming process is performed and before the second through-substrate via is exposed.

9. The wafer stacking method according to claim 4, further comprising:

bonding a fourth wafer to the third wafer to form a third wafer stack structure;

performing a third edge defect inspection on the third wafer stack structure to find a third edge defect and measure a third distance in the radial direction between an edge of the third wafer stack structure and an end of the third edge defect away from the edge of the third wafer stack structure; and performing a third trimming process with a range of a third width from the edge of the third wafer stack structure to remove the third edge defect, wherein the third width is greater than or equal to the third distance.

10. The wafer stacking method according to claim 9, wherein the third width is greater than the second width.

11. The wafer stacking method according to claim 9, further comprising:

performing a thinning process on the fourth wafer after the third trimming process is performed.

12. The wafer stacking method according to claim 11, wherein the fourth wafer comprises a second through-substrate via, and the wafer stacking method further comprises:

removing a portion of the fourth wafer to expose the second through-substrate via; and forming a redistribution layer structure on the fourth wafer, wherein the redistribution layer structure is electrically connected to the second through-substrate via.

13. The wafer stacking method according to claim 12, further comprising:

forming a passivation layer on the third wafer stack structure after the third trimming process is performed and before the second through-substrate via is exposed.

14. The wafer stacking method according to claim 1, further comprising:

providing a third wafer;

bonding a fourth wafer to the third wafer to form a second wafer stack structure;

performing a second edge defect inspection on the second wafer stack structure to find a second edge defect and measure a second distance in the radial direction between an edge of the second wafer stack structure and an end of the second edge defect away from the edge of the second wafer stack structure; and performing a second trimming process with a range of a second width from the edge of the second wafer stack structure to remove the second edge defect, wherein the second width is greater than or equal to the second distance.

15. The wafer stacking method according to claim 14, further comprising:

bonding the fourth wafer to the second wafer to form a third wafer stack structure;

performing a third edge defect inspection on the third wafer stack structure to find a third edge defect and measure a third distance in the radial direction between an edge of the third wafer stack structure and an end of the third edge defect away from the edge of the third wafer stack structure; and performing a third trimming process with a range of a third width from the edge of the third wafer stack structure to remove the third edge defect, wherein the third width is greater than or equal to the third distance.

16. The wafer stacking method according to claim 15, wherein the third width is greater than the first width and the second width.

17. The wafer stacking method according to claim 14, wherein the first width and the second width are the same width.

18. The wafer stacking method according to claim 14, wherein the first width and the second width are different widths.

* * * * *